US012677279B2

(12) United States Patent
Kim et al.

(10) Patent No.: US 12,677,279 B2
(45) Date of Patent: Jul. 7, 2026

(54) METHOD FOR TRANSMITTING AND RECEIVING PHYSICAL SHARED CHANNEL ON BASIS OF HARQ IN WIRELESS COMMUNICATION SYSTEM, AND APPARATUS THEREFOR

(71) Applicant: LG Electronics Inc., Seoul (KR)

(72) Inventors: Bonghoe Kim, Seoul (KR); Jongwoong Shin, Seoul (KR)

(73) Assignee: LG Electronics Inc., Seoul (KR)

( * ) Notice: Subject to any disclaimer, the term of this patent is extended or adjusted under 35 U.S.C. 154(b) by 337 days.

(21) Appl. No.: 18/576,471

(22) PCT Filed: Jul. 12, 2021

(86) PCT No.: PCT/KR2021/008905
§ 371 (c)(1),
(2) Date: Jan. 4, 2024

(87) PCT Pub. No.: WO2023/286882
PCT Pub. Date: Jan. 19, 2023

(65) Prior Publication Data
US 2024/0357588 A1     Oct. 24, 2024

(51) Int. Cl.
*H04W 72/1273* (2023.01)
*H03M 13/13* (2006.01)
*H04W 72/231* (2023.01)

(52) U.S. Cl.
CPC ....... *H04W 72/1273* (2013.01); *H03M 13/13* (2013.01); *H04W 72/231* (2023.01)

(58) Field of Classification Search
CPC ... H04L 1/0009; H04L 5/0016; H04L 1/0076; H04L 25/03898; H03M 13/2906; H03M 13/6525; H03M 13/13; H03M 13/05; H03M 7/30; H03M 7/3066
See application file for complete search history.

(56) References Cited

U.S. PATENT DOCUMENTS 11,451,324 B2 *  9/2022  Peng ..................... H03M 13/13

FOREIGN PATENT DOCUMENTS

| KR | 10-2012- 0129245 | 11/2012 |
| KR | 10-1769375 | 8/2017 |
| WO | WO 2014/176204 | 10/2014 |
| WO | WO 2017/196114 | 11/2017 |
| WO | 2019/098677 A1 | 5/2019 |
| WO | 2020/204496 A1 | 10/2020 |

OTHER PUBLICATIONS

Futurewei, "Alignment of EN-DC/NE-DC parameter names," 3GPP TSG-RAN WG1 Meeting #105-e, R1-2106343, e-Meeting, May 19-27, 2021, 56 pages.
Extended European Search Report in European Appln. No. 21950230.9, mailed on Feb. 6, 2025, 8 pages.

* cited by examiner

*Primary Examiner* — Tu X Nguyen
(74) *Attorney, Agent, or Firm* — Fish & Richardson P.C.

(57) ABSTRACT

A method of a user equipment (UE) for receiving a physical downlink shared channel (PDSCH) in a wireless communication system according to an embodiment of the present disclosure comprises receiving downlink control information (DCI) scheduling the PDSCH and receiving the PDSCH based on the DCL. The PDSCH is related to a codeword generated based on a polar code.

12 Claims, 15 Drawing Sheets

· DL/UL ACK/NACK
· UE CQI/PMI RI REPORT
  USING PUSCH AND PUCCH

FIG. 12
Information Bit          PC Frozen Bit          Frozen Bit
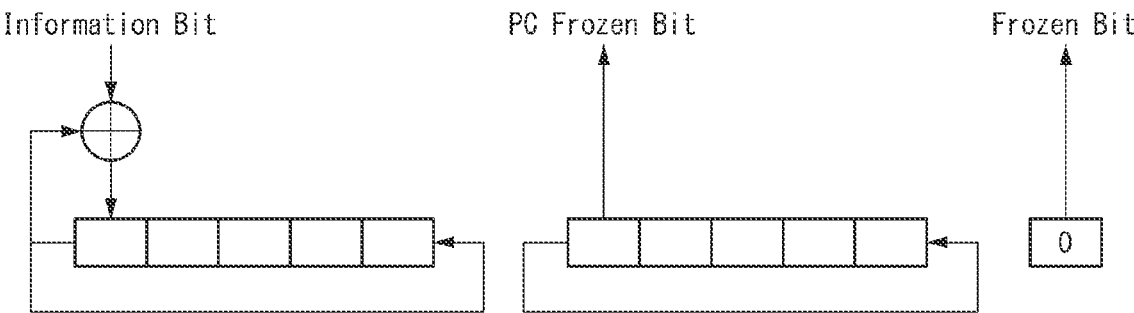
Left cyclic shift upon encoding each bit
FIG. 13
Rel
| 0 | 1 | 2 | 3 | 4 | 5 | 6 | 7 | 8 | 9 | 10 | 11 | 12 | 13 | 14 | 15 | 13a |
|---|---|---|---|---|---|---|---|---|---|----|----|----|----|----|----|-----|
| 0 | 1 | 2 | 4 | 8 | 3 | 5 | 6 | 9 | 10 | 12 | 7 | 11 | 13 | 14 | 15 | 13b |
1st Tx
| | | | u0 | | u1 | u2 | u3 | u4 | u5 | u6 | u7 | u8 | u9 | u10 | u11 | 13c |
|---|---|---|----|---|----|----|----|----|----|----|----|----|----|-----|-----|-----|
2nd Tx
| | | | | | | | u0 | | | | u1 | u2 | u4 | u5 | u6 | 13d |
|---|---|---|---|---|---|---|----|---|---|---|----|----|----|----|----|-----|
FIG. 14
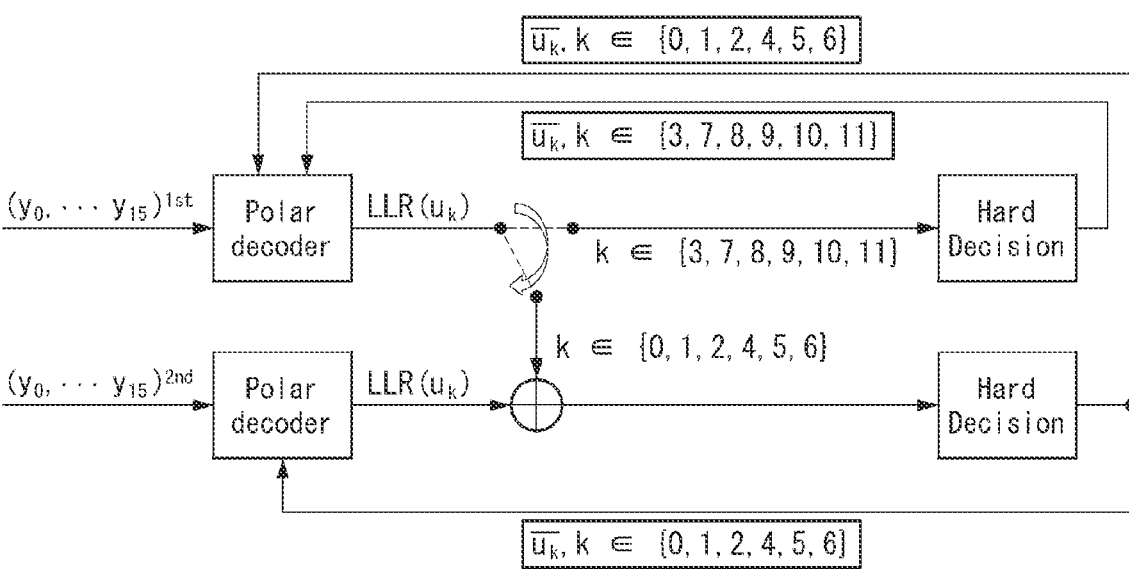

FIG. 15

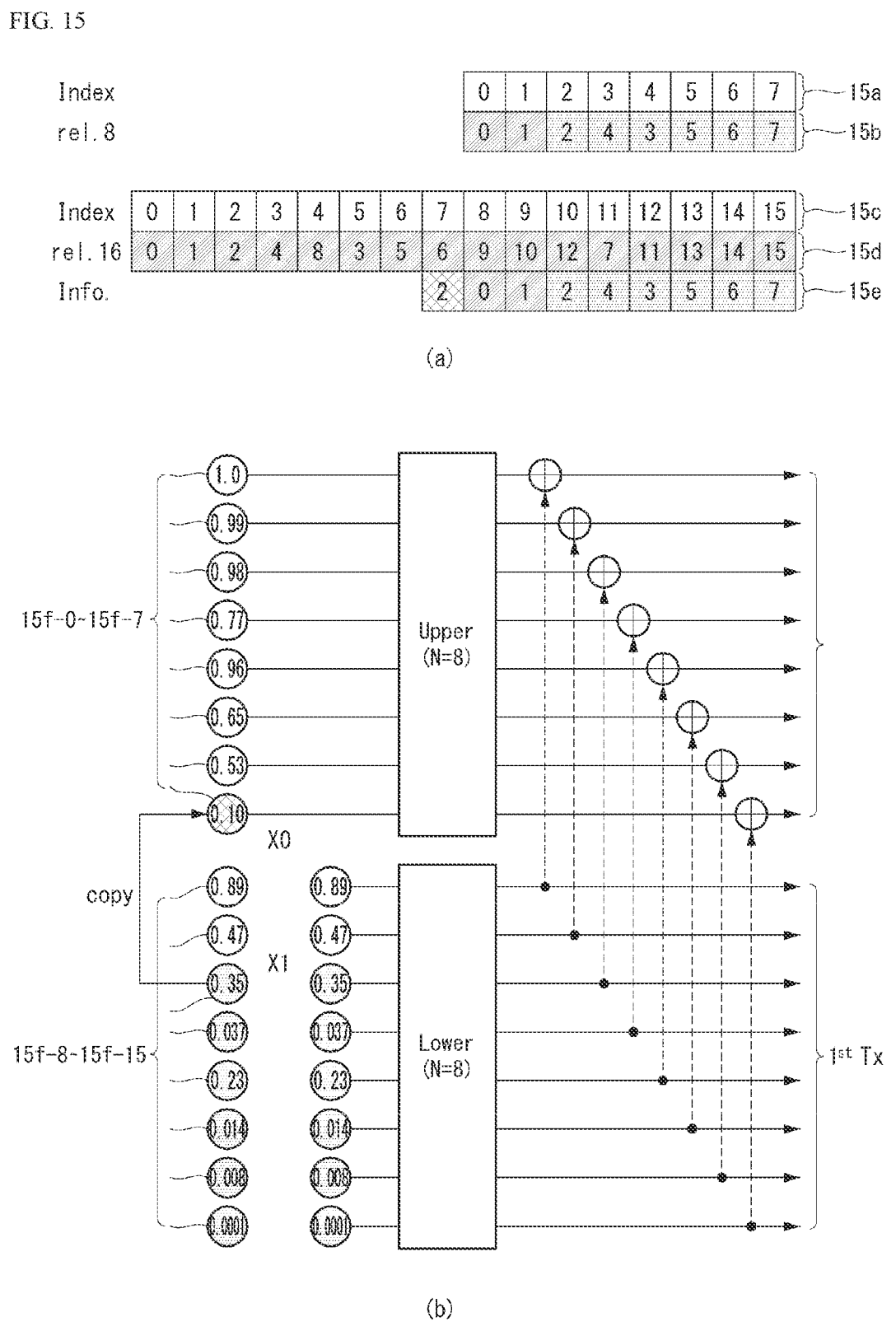

| Index | 0 | 1 | 2 | 3 | 4 | 5 | 6 | 7 | ~ 15a |
|-------|---|---|---|---|---|---|---|---|-------|
| rel. 8 | 0 | 1 | 2 | 4 | 3 | 5 | 6 | 7 | ~ 15b |

| Index | 0 | 1 | 2 | 3 | 4 | 5 | 6 | 7 | 8 | 9 | 10 | 11 | 12 | 13 | 14 | 15 | ~ 15c |
|-------|---|---|---|---|---|---|---|---|---|---|----|----|----|----|----|----|-------|
| rel. 16 | 0 | 1 | 2 | 4 | 8 | 3 | 5 | 6 | 9 | 10 | 12 | 7 | 11 | 13 | 14 | 15 | ~ 15d |
| Info. | | | | | | | | 2 | 0 | 1 | 2 | 4 | 3 | 5 | 6 | 7 | ~ 15e |

METHOD FOR TRANSMITTING AND RECEIVING PHYSICAL SHARED CHANNEL ON BASIS OF HARQ IN WIRELESS COMMUNICATION SYSTEM, AND APPARATUS THEREFOR

CROSS-REFERENCE TO RELATED APPLICATIONS

This application is a National Stage application under 35 U.S.C. § 371 of International Application No. PCT/KR2021/008905, filed on Jul. 12, 2021. The disclosures of the prior application is incorporated by reference in its entirety.

TECHNICAL FIELD

The present disclosure relates to a method of transmitting and receiving a physical shared channel based on HARQ in a wireless communication system, and a device therefor.

BACKGROUND

Mobile communication systems have been developed to provide voice services, while ensuring activity of users. However, coverage of the mobile communication systems has been extended up to data services, as well as voice service, and currently, an explosive increase in traffic has caused shortage of resources, and since users expect relatively high-speed services, an advanced mobile communication system is required.

Requirements of a next-generation mobile communication system include accommodation of explosive data traffic, a significant increase in a transfer rate per user, accommodation of considerably increased number of connection devices, very low end-to-end latency, and high energy efficiency. To this end, there have been researched various technologies such as dual connectivity, massive multiple input multiple output (MIMO), in-band full duplex, non-orthogonal multiple access (NOMA), super wideband, device networking, and the like.

SUMMARY

The present disclosure proposes a method for transmitting a signal based on HARQ, and an apparatus therefor. Polar code is used only for transmission of control data in the NR standard and does not support HARQ. It is necessary to support HARQ in order to use the polar code for data transmission in the 6G system In the case of the Incremental Freezing (IF) HARQ method, the bit channel index allocated to the data bit changes. Because of this, combining the codeword received based on retransmission and the codeword received based on first transmission is possible after decoding the codeword received based on the retransmission.

In the case of the Incremental Redundancy (IR) HARQ method, when a retransmitted codeword is received, combining operation is possible without decoding the codeword. Therefore, IF HARQ does not improve system performance significantly compared to IR HARQ.

Meanwhile, in order to support IR HARQ, the characteristic that the codeword generated for first transmission must be included in the codeword generated for the retransmission must be satisfied. In this regard, the size of the polar code (mother code size) for the retransmission may be different from the size of the polar code used for first transmission. In this case, since the data bits are allocated to bit channel indices determined in an order according to the reliability of the polar encoder, a problem may occur in which the codeword generated for first transmission is not included in the codeword generated for the retransmission.

The present disclosure proposes a method to solve the above-mentioned problems in supporting IR HARQ based on polar code.

In addition, if a UE fails to receive a PDCCH scheduling an initial transmission when supporting polar code-based IR-HARQ for data transmission, the following problems i) or ii) may occur.

i) a mother code size used by the base station and a mother code size expected by the UE are changed ii) even if the mother code size expected by the UE is the same as a mother code size used to generate a codeword, an arrangement of data bits within a codeword generated based on a copy operation depending on retransmission is different from an arrangement of data bits expected by the UE In the above i) and ii), the UE performing decoding of the codeword determines that an error has occurred even though the codeword was received normally without error. Afterwards, as the UE repeatedly requests retransmission from the base station, unnecessary signaling overhead is caused.

The present disclosure provides a signaling method for solving the above-described problems.

The technical objects to be achieved by the present disclosure are not limited to those that have been described hereinabove merely by way of example, and other technical objects that are not mentioned can be clearly understood by those skilled in the art, to which the present disclosure pertains, from the following descriptions.

A method of a user equipment (UE) for receiving a physical downlink shared channel (PDSCH) in a wireless communication system according to an embodiment of the present disclosure comprises receiving downlink control information (DCI) scheduling the PDSCH and receiving the PDSCH based on the DCI. The PDSCH is related to a codeword generated based on a polar code.

Based on a transmission of the PDSCH being an initial transmission, the PDSCH is related to a first codeword generated based on a first polar code. The first codeword is generated based on one or more first bit channel indexes allocated to a data block related to the PDSCH among bit channel indexes of the first polar code.

Based on the transmission of the PDSCH being a retransmission, the PDSCH is related to a second codeword generated based on a second polar code. The second codeword is generated based on one or more second bit channel indexes allocated to the data block among bit channel indexes of the second polar code.

Based on the one or more second bit channel indexes including one or more third bit channel indexes belonging to a lower polar subcode of the second polar code, the one or more second bit channel indexes further include one or more fourth bit channel indexes determined based on the one or more third bit channel indexes.

The DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH.

The information representing the RV represents one of one or more values determined based on the size of the polar code related to the PDSCH, and the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

The one or more values determined based on the size of the polar code related to the PDSCH may be related to one or more specific locations of locations within a circular buffer to which the codeword related to the PDSCH is input.

The one or more specific locations may be related to at least one of i) a first bit channel index of the lower polar subcode of the polar code related to the PDSCH or ii) a first bit channel index of the upper polar subcode of the polar code related to the PDSCH.

The one or more values determined based on the size of the polar code related to the PDSCH may be determined based on a size of the first polar code and a number of bits of the information representing the RV.

Based on a size of the second polar code being greater than a size of the first polar code and a size of the data block being greater than or equal to a specific value, the one or more second bit channel indexes may further include the one or more fourth bit channel indexes.

The specific value may be determined based on a ranking of a bit channel index with a highest value of a reliability among bit channel indexes belonging to the lower polar subcode of the second polar code, and the ranking may be defined as an order based on a value of the reliability within a range of all bit channel indexes of the second polar code.

The one or more fourth bit channel indexes may be determined based on a number of the one or more third bit channel indexes and a size of the data block.

The one or more fourth bit channel indexes may be based on a specific number of bit channel indexes determined in a specific range of the second polar code. The specific range may be based on a range excluding specific bit channel indexes determined based on the size of the data block and an order of a reliability among the bit channel indexes of the second polar code.

The specific number of bit channel indexes may be based on a specific number of bit channel indexes determined based on the order of the reliability among bit channel indexes of an upper polar subcode based on the specific range.

The specific number may be based on the number of the one or more third bit channel indexes.

A user equipment (UE) receiving a physical downlink shared channel (PDSCH) in a wireless communication system according to another embodiment of the present disclosure comprises one or more transceivers, one or more processors configured to control the one or more transceivers, and one or more memories operably connectable to the one or more processors. The one or more memories are configured to store instructions that allow the one or more processors to perform operations based on being executed by the one or more processors.

The operations comprise receiving downlink control information (DCI) scheduling the PDSCH and receiving the PDSCH based on the DCI. The PDSCH is related to a codeword generated based on a polar code.

Based on a transmission of the PDSCH being an initial transmission, the PDSCH is related to a first codeword generated based on a first polar code. The first codeword is generated based on one or more first bit channel indexes allocated to a data block related to the PDSCH among bit channel indexes of the first polar code.

Based on the transmission of the PDSCH being a retransmission, the PDSCH is related to a second codeword generated based on a second polar code. The second codeword is generated based on one or more second bit channel indexes allocated to the data block among bit channel indexes of the second polar code.

Based on the one or more second bit channel indexes including one or more third bit channel indexes belonging to a lower polar subcode of the second polar code, the one or more second bit channel indexes further include one or more fourth bit channel indexes determined based on the one or more third bit channel indexes.

The DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH.

The information representing the RV represents one of one or more values determined based on the size of the polar code related to the PDSCH, and the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

A method of a base station (BS) for transmitting a physical downlink shared channel (PDSCH) in a wireless communication system according to another embodiment of the present disclosure comprises transmitting downlink control information (DCI) scheduling the PDSCH and transmitting the PDSCH based on the DCI. The PDSCH is related to a codeword generated based on a polar code.

Based on a transmission of the PDSCH being an initial transmission, the PDSCH is related to a first codeword generated based on a first polar code. The first codeword is generated based on one or more first bit channel indexes allocated to a data block related to the PDSCH among bit channel indexes of the first polar code.

Based on the transmission of the PDSCH being a retransmission, the PDSCH is related to a second codeword generated based on a second polar code. The second codeword is generated based on one or more second bit channel indexes allocated to the data block among bit channel indexes of the second polar code.

Based on the one or more second bit channel indexes including one or more third bit channel indexes belonging to a lower polar subcode of the second polar code, the one or more second bit channel indexes further include one or more fourth bit channel indexes determined based on the one or more third bit channel indexes.

The DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH.

The information representing the RV represents one of one or more values determined based on the size of the polar code related to the PDSCH, and the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

A base station (BS) transmitting a physical downlink shared channel (PDSCH) in a wireless communication system according to another embodiment of the present disclosure comprises one or more transceivers, one or more processors configured to control the one or more transceivers, and one or more memories operably connectable to the one or more processors. The one or more memories are configured to store instructions that allow the one or more processors to perform operations based on being executed by the one or more processors.

The operations comprise transmitting downlink control information (DCI) scheduling the PDSCH and transmitting the PDSCH based on the DCI. The PDSCH is related to a codeword generated based on a polar code.

Based on a transmission of the PDSCH being an initial transmission, the PDSCH is related to a first codeword generated based on a first polar code. The first codeword is generated based on one or more first bit channel indexes allocated to a data block related to the PDSCH among bit channel indexes of the first polar code.

Based on the transmission of the PDSCH being a retransmission, the PDSCH is related to a second codeword generated based on a second polar code. The second codeword is generated based on one or more second bit channel indexes allocated to the data block among bit channel indexes of the second polar code.

Based on the one or more second bit channel indexes including one or more third bit channel indexes belonging to a lower polar subcode of the second polar code, the one or more second bit channel indexes further include one or more fourth bit channel indexes determined based on the one or more third bit channel indexes.

The DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH.

The information representing the RV represents one of one or more values determined based on the size of the polar code related to the PDSCH, and the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

A device according to another embodiment of the present disclosure comprises one or more memories and one or more processors operably connected to the one or more memories.

The one or more memories are configured to store instructions that allow the one or more processors to perform operations based on being executed by the one or more processors.

The operations comprise receiving downlink control information (DCI) scheduling a physical downlink shared channel (PDSCH and receiving the PDSCH based on the DCI. The PDSCH is related to a codeword generated based on a polar code.

Based on a transmission of the PDSCH being an initial transmission, the PDSCH is related to a first codeword generated based on a first polar code. The first codeword is generated based on one or more first bit channel indexes allocated to a data block related to the PDSCH among bit channel indexes of the first polar code.

Based on the transmission of the PDSCH being a retransmission, the PDSCH is related to a second codeword generated based on a second polar code. The second codeword is generated based on one or more second bit channel indexes allocated to the data block among bit channel indexes of the second polar code.

Based on the one or more second bit channel indexes including one or more third bit channel indexes belonging to a lower polar subcode of the second polar code, the one or more second bit channel indexes further include one or more fourth bit channel indexes determined based on the one or more third bit channel indexes.

The DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH.

The information representing the RV represents one of one or more values determined based on the size of the polar code related to the PDSCH, and the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

One or more non-transitory computer readable mediums according to another embodiment of the present disclosure store one or more instructions.

The one or more instructions are configured to allow one or more processors to perform operations based on being executed by the one or more processors.

The operations comprise receiving downlink control information (DCI) scheduling a physical downlink shared channel (PDSCH) and receiving the PDSCH based on the DCI. The PDSCH is related to a codeword generated based on a polar code.

Based on a transmission of the PDSCH being an initial transmission, the PDSCH is related to a first codeword generated based on a first polar code. The first codeword is generated based on one or more first bit channel indexes allocated to a data block related to the PDSCH among bit channel indexes of the first polar code.

Based on the transmission of the PDSCH being a retransmission, the PDSCH is related to a second codeword generated based on a second polar code. The second codeword is generated based on one or more second bit channel indexes allocated to the data block among bit channel indexes of the second polar code.

Based on the one or more second bit channel indexes including one or more third bit channel indexes belonging to a lower polar subcode of the second polar code, the one or more second bit channel indexes further include one or more fourth bit channel indexes determined based on the one or more third bit channel indexes.

The DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH.

The information representing the RV represents one of one or more values determined based on the size of the polar code related to the PDSCH, and the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

A method of a user equipment (UE) for transmitting a physical uplink shared channel (PUSCH) in a wireless communication system according to another embodiment of the present disclosure comprises receiving downlink control information (DCI) scheduling the PUSCH and transmitting the PUSCH based on the DCL. The PUSCH is related to a codeword generated based on a polar code.

Based on a transmission of the PUSCH being an initial transmission, the PUSCH is related to a first codeword generated based on a first polar code, the first codeword is generated based on one or more first bit channel indexes allocated to a data block related to the PUSCH among bit channel indexes of the first polar code.

Based on the transmission of the PUSCH being a retransmission, the PUSCH is related to a second codeword generated based on a second polar code. The second codeword is generated based on one or more second bit channel indexes allocated to the data block among bit channel indexes of the second polar code.

Based on the one or more second bit channel indexes including one or more third bit channel indexes belonging to a lower polar subcode of the second polar code, the one or more second bit channel indexes further include one or more fourth bit channel indexes determined based on the one or more third bit channel indexes.

The DCI includes i) information representing a size of a polar code related to the PUSCH, ii) information representing whether the one or more fourth bit channel indexes are used to generate a codeword related to the PUSCH, and iii) information representing a redundancy version (RV) related to the PUSCH.

The information representing the RV represents one of one or more values determined based on the size of the polar code related to the PUSCH, and the one or more values determined based on the size of the polar code related to the PUSCH are related to at least one of i) a starting point of a lower polar subcode of the polar code related to the PUSCH or ii) a starting point of an upper polar subcode of the polar code related to the PUSCH.

According to embodiments of the present disclosure, if a transmission of a PDSCH is a retransmission, a second codeword related to the PDSCH is generated based on one or more fourth bit channel indexes. Even if a data bit is arranged to a bit channel index of a lower polar subcode, the second codeword is generated based on the one or more fourth bit channel indexes, and thus support characteristics of IR-HARQ can be satisfied. As above, since IR HARQ based on a polar code can be used for data transmission, system performance can be improved in terms of reliability.

Further, according to an IR HARQ scheme based on the polar code, since the received bits are immediately combined without going through decoding, performance of a polar code based HARQ operation can be further improved compared to the existing IF-HARQ scheme.

According to embodiments of the present disclosure, DCI scheduling the PDSCH includes information representing whether the one or more fourth bit channel indexes are used to generate the codeword related to the PDSCH.

Accordingly, even if a UE fails to receive a PDCCH scheduling an initial transmission, the UE can normally perform, based on DCI scheduling a subsequently retransmitted PDSCH, decoding of a codeword related to the PDSCH. For the polar code-based IR-HARQ applied to the data transmission, robustness for a PDCCH error can be improved.

Further, an error operation due to the PDCCH detection failure (PDSCH related codeword decoding failure) is prevented. Since the unnecessary PDSCH retransmission is prevented, a signaling procedure for the polar code based IR-HARQ support can be improved in terms of signaling overhead and UE power consumption.

According to embodiments of the present disclosure, the DCI includes information indicating a redundancy version (RV) related to the PDSCH, and the information indicating the RV represents one of one or more values determined based on a size of the polar code related to the PDSCH. The one of one or more values determined based on the size of the polar code related to the PDSCH may be related to one or more specific locations of locations within a circular buffer to which the codeword related to the PDSCH is input. Further, the one or more specific locations may be related to at least one of i) a first bit channel index of a lower polar subcode of the polar code related to the PDSCH or ii) a first bit channel index of an upper polar subcode of the polar code related to the PDSCH.

If coded bits within the circular buffer are selected and retransmitted based on a type of rate matching, a starting point of the lower polar subcode or a starting point of the upper polar subcode may be indicated within the circular buffer through the RV. Therefore, decoding of a codeword related to the retransmission can be performed based on a mother code size that is less than the mother code size used to generate the codeword. As a result, there is an advantage in terms of receiver implementation complexity.

Effects that could be achieved with the present disclosure are not limited to those that have been described hereinabove merely by way of example, and other effects and advantages of the present disclosure will be more clearly understood from the following description by a person skilled in the art to which the present disclosure pertains.

BRIEF DESCRIPTION OF THE DRAWINGS

The accompanying drawings are provided to help understanding of the present disclosure, and may provide embodiments of the present disclosure together with a detailed description. However, the technical features of the present disclosure are not limited to specific drawings, and the features disclosed in each drawing may be combined with each other to constitute a new embodiment. Reference numerals in each drawing may refer to structural elements.

FIG. 12 is a diagram for explaining generation of a parity check bit according to an embodiment of the present disclosure.

FIG. 13 illustrates a polar encoding operation performed to support IF-HARQ according to an embodiment of the present disclosure.

FIG. 14 illustrates a receiver structure supporting IF-HARQ according to an embodiment of the present disclosure.

FIG. 15 is a diagram for explaining an encoding operation related to incremental redundancy according to an embodiment of the present disclosure.

FIG. 16 illustrates bit channel indices rearranged in order of a reliability of a bit channel according to an embodiment of the present disclosure.

FIG. 17 illustrates an example of data arranged to bit channel indexes based on a specific payload size in accordance with an embodiment of the present disclosure.

FIG. 18 illustrates another example of data arranged to bit channel indexes based on a specific payload size in accordance with an embodiment of the present disclosure.

DETAILED DESCRIPTION

Figure 1:
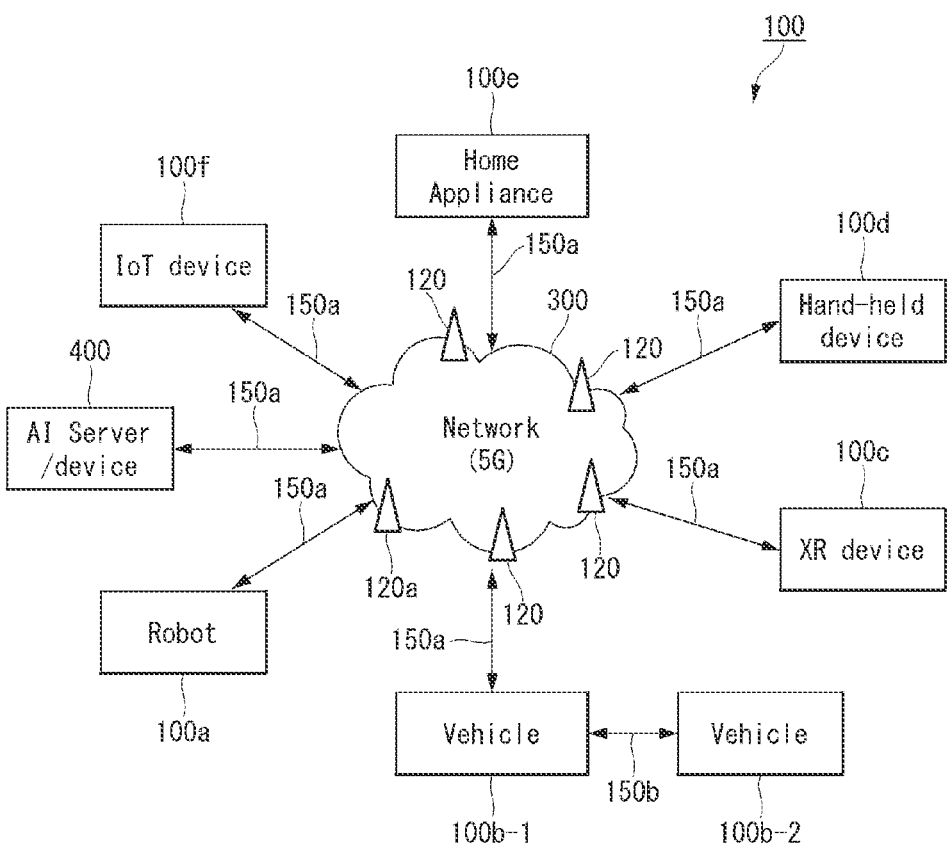
FIG. 1 is a view showing an example of a communication system applicable to the present disclosure.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the drawings, procedures or steps which render the scope of the present disclosure unnecessarily ambiguous will be omitted and procedures or steps which can be understood by those skilled in the art will be omitted.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present disclosure, a description is mainly made of a data transmission and reception relationship between a Base Station (BS) and a mobile station. A BS refers to a terminal node of a network, which directly communicates with a mobile station. A specific operation described as being performed by the BS may be performed by an upper node of the BS.

That is, it is apparent that, in a network comprised of a plurality of network nodes including a BS, various operations performed for communication with a mobile station may be performed by the BS, or network nodes other than the BS. The term "BS" may be replaced with a fixed station, a Node B, an evolved Node B (eNode B or eNB), an Advanced Base Station (ABS), an access point, etc.

In the embodiments of the present disclosure, the term terminal may be replaced with a UE, a Mobile Station (MS), a Subscriber Station (SS), a Mobile Subscriber Station (MSS), a mobile terminal, an Advanced Mobile Station (AMS), etc.

A transmitter is a fixed and/or mobile node that provides a data service or a voice service and a receiver is a fixed and/or mobile node that receives a data service or a voice service. Therefore, on uplink (UL), a mobile station may serve as a transmitter and a BS may serve as a receiver. Likewise, on downlink (DL), the mobile station may serve as a receiver and the BS may serve as a transmitter.

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, 3GPP 5th generation (5G) new radio (NR) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331.

In addition, the embodiments of the present disclosure are applicable to other radio access systems and are not limited to the above-described system. For example, the embodiments of the present disclosure are applicable to systems applied after a 3GPP 5G NR system and are not limited to a specific system.

That is, steps or parts that are not described to clarify the technical features of the present disclosure may be supported by those documents. Further, all terms as set forth herein may be explained by the standard documents.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the disclosure.

The following detailed description includes specific terms in order to provide a thorough understanding of the present disclosure. However, it will be apparent to those skilled in the art that the specific terms may be replaced with other terms without departing the technical spirit and scope of the present disclosure.

The embodiments of the present disclosure can be applied to various radio access systems such as Code Division Multiple Access (CDMA). Frequency Division Multiple Access (FDMA), Time Division Multiple Access (TDMA), Orthogonal Frequency Division Multiple Access (OFDMA), Single Carrier Frequency Division Multiple Access (SC-FDMA), etc.

Hereinafter, in order to clarify the following description, a description is made based on a 3GPP communication system (e.g., LTE, NR, etc.), but the technical spirit of the present disclosure is not limited thereto. LTE may refer to technology after 3GPP TS 36.xxx Release 8. In detail. LTE technology after 3GPP TS 36.xxx Release 10 may be referred to as LTE-A, and LTE technology after 3GPP TS 36.xxx Release 13 may be referred to as LTE-A pro. 3GPP NR may refer to technology after TS 38.xxx Release 15. 3GPP 6G may refer to technology TS Release 17 and/or Release 18. "xxx" may refer to a detailed number of a standard document. LTE/NR/6G may be collectively referred to as a 3GPP system.

For background arts, terms, abbreviations, etc. used in the present disclosure, refer to matters described in the standard documents published prior to the present disclosure. For example, reference may be made to the standard documents 36.xxx and 38.xxx.
Communication System Applicable to the Present Disclosure Without being limited thereto, various descriptions, functions, procedures, proposals, methods and/or operational flowcharts of the present disclosure disclosed herein are applicable to various fields requiring wireless communication/connection (e.g., 5G).

Hereinafter, a more detailed description will be given with reference to the drawings. In the following drawings/description, the same reference numerals may exemplify the same or corresponding hardware blocks, software blocks or functional blocks unless indicated otherwise.

FIG. 1 illustrates an example of a communication system applicable to the present disclosure. Referring to FIG. 1, the communication system 100 applicable to the present disclosure includes a wireless device, a base station and a network. The wireless device refers to a device for performing communication using radio access technology (e.g., 5G NR or LTE) and may be referred to as a communication/wireless/5G device. Without being limited thereto, the wireless device may include a robot 100a, vehicles 100b-1 and 100b-2, an extended reality (XR) device 100c, a hand-held device 100d, a home appliance 100e, an Internet of Thing (IoT) device 100f, and an artificial intelligence (AI) device/server 400. For example, the vehicles may include a vehicle having a wireless communication function, an autonomous vehicle, a vehicle capable of performing vehicle-to-vehicle communication, etc. The vehicles 100b-1 and 100b-2 may include an unmanned aerial vehicle (UAV) (e.g., a drone). The XR device 100c includes an augmented reality (AR)/virtual reality (VR)/mixed reality (MR) device and may be implemented in the form of a head-mounted device (HMD), a head-up display (HUD) provided in a vehicle, a television, a smartphone, a computer, a wearable device, a home appliance, a digital signage, a vehicle or a robot. The hand-held device 100d may include a smartphone, a smart pad, a wearable device (e.g., a smart watch or smart glasses), a computer (e.g., a laptop), etc. The home appliance 100e may include a TV, a refrigerator, a washing machine, etc. The IoT device 100f may include a sensor, a smart meter, etc. For example, the base station 120 and the network 130 may be implemented by a wireless device, and a specific wireless device 120a may operate as a base station/network node for another wireless device.

The wireless devices 100a to 100f may be connected to the network 130 through the base station 120. AI technology is applicable to the wireless devices 100a to 1001, and the wireless devices 100a to 100f may be connected to the AI server 400 through the network 130. The network 130 may be configured using a 3G network, a 4G (e.g., LTE) network or a 5G (e.g., NR) network, etc. The wireless devices 100a to 100f may communicate with each other through the base station 120/the network 130 or perform direct communication (e.g., sidelink communication) without through the base station 120/the network 130. For example, the vehicles 100b-1 and 100b-2 may perform direct communication (e.g., vehicle to vehicle (V2V)/vehicle to everything (V2X) communication). In addition, the IoT device 100f (e.g., a sensor) may perform direct communication with another IoT device (e.g., a sensor) or the other wireless devices 100a to 100f.

Wireless communications/connections 150a, 150b and 150c may be established between the wireless devices 100a to 100f/the base station 120 and the base station 120/the base station 120. Here, wireless communication/connection may be established through various radio access technologies (e.g., 5G NR) such as uplink/downlink communication 150a, sidelink communication 150b (or D2D communication) or communication 150c between base stations (e.g., relay, integrated access backhaul (IAB). The wireless device and the base station/wireless device or the base station and the base station may transmit/receive radio signals to/from each other through wireless communication/connection 150a. 150b and 150c. For example, wireless communication/connection 150a, 150b and 150c may enable signal transmission/reception through various physical channels. To this end, based on the various proposals of the present disclosure, at least some of various configuration information setting processes for transmission/reception of radio signals, various signal processing procedures (e.g., channel encoding/decoding, modulation/demodulation, resource mapping/demapping, etc.), resource allocation processes, etc. may be performed.
Communication System Applicable to the Present Disclosure FIG. 2 illustrates an example of a wireless device applicable to the present disclosure.

Figure 2:
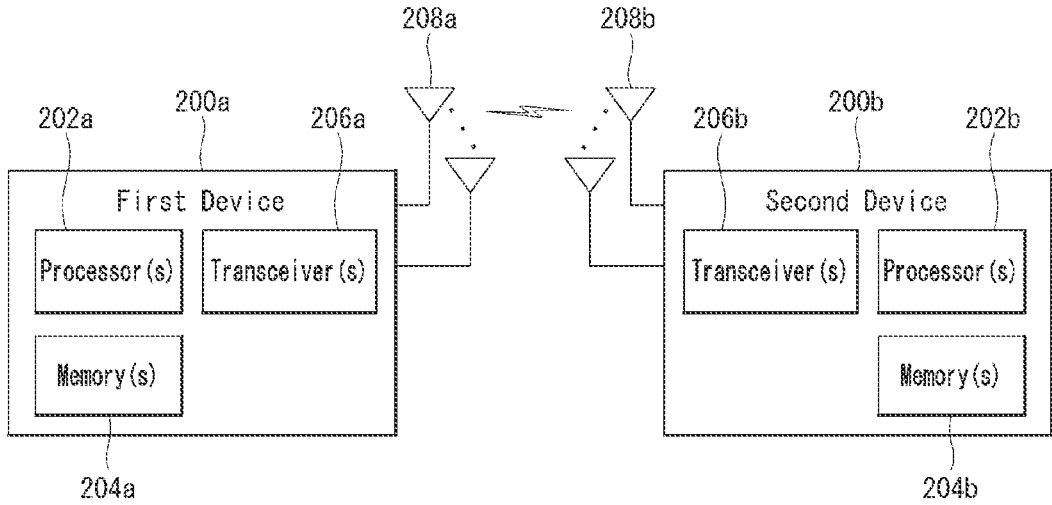
FIG. 2 is a view showing an example of a wireless apparatus applicable to the present disclosure.

Referring to FIG. 2, a first wireless device 200a and a second wireless device 200b may transmit and receive radio signals through various radio access technologies (e.g., LTE or NR). Here, {the first wireless device 200a, the second wireless device 200b} may correspond to {the wireless device 100x, the base station 120} and/or {the wireless device 100x, the wireless device 100x} of FIG. 1.

The first wireless device 200a may include one or more processors 202a and one or more memories 204a and may further include one or more transceivers 206a and/or one or more antennas 208a. The processor 202a may be configured to control the memory 204a and/or the transceiver 206a and to implement descriptions, functions, procedures, proposals, methods and/or operational flowcharts disclosed herein. For example, the processor 202a may process information in the memory 204a to generate first information/signal and then transmit a radio signal including the first information/signal through the transceiver 206a. In addition, the processor 202a may receive a radio signal including second information/signal through the transceiver 206a and then store information obtained from signal processing of the second information/signal in the memory 204a. The memory 204a may be connected with the processor 202a, and store a variety of information related to operation of the processor 202a. For example, the memory 204a may store software code including instructions for performing all or some of the processes controlled by the processor 202a or performing the descriptions, functions, procedures, proposals, methods and/or operational flowcharts disclosed herein. Here, the processor 202a and the memory 204a may be part of a communication modem/circuit/chip designed to implement wireless communication technology (e.g., LTE or NR). The transceiver 206a may be connected with the processor 202a to transmit and/or receive radio signals through one or more antennas 208a. The transceiver 206a may include a transmitter and/or a receiver. The transceiver 206a may be used interchangeably with a radio frequency (RF) unit. In the present disclosure, the wireless device may refer to a communication modem/circuit/chip.

The second wireless device 200b may include one or more processors 202b and one or more memories 204b and may further include one or more transceivers 206b and/or one or more antennas 208b. The processor 202b may be configured to control the memory 204b and/or the transceiver 206b and to implement the descriptions, functions, procedures, proposals, methods and/or operational flowcharts disclosed herein. For example, the processor 202b may process information in the memory 204b to generate third information/signal and then transmit the third information/signal through the transceiver 206b. In addition, the processor 202b may receive a radio signal including fourth information/signal through the transceiver 206b and then store information obtained from signal processing of the fourth information/signal in the memory 204b. The memory 204b may be connected with the processor 202b to store a variety of information related to operation of the processor 202b. For example, the memory 204b may store software code including instructions for performing all or some of the processes controlled by the processor 202b or performing the descriptions, functions, procedures, proposals, methods and/or operational flowcharts disclosed herein. Herein, the processor 202b and the memory 204b may be part of a communication modem/circuit/chip designed to implement wireless communication technology (e.g., LTE or NR). The transceiver 206b may be connected with the processor 202b to transmit and/or receive radio signals through one or more antennas 208b. The transceiver 206b may include a transmitter and/or a receiver. The transceiver 206b may be used interchangeably with a radio frequency (RF) unit. In the present disclosure, the wireless device may refer to a communication modem/circuit/chip.

Hereinafter, hardware elements of the wireless devices 200a and 200b will be described in greater detail. Without being limited thereto, one or more protocol layers may be implemented by one or more processors 202a and 202b. For example, one or more processors 202a and 202b may implement one or more layers (e.g., functional layers such as PHY (physical), MAC (media access control), RLC (radio link control), PDCP (packet data convergence protocol), RRC (radio resource control), SDAP (service data adaptation protocol)). One or more processors 202a and 202b may generate one or more protocol data units (PDUs) and/or one or more service data unit (SDU) according to the descriptions, functions, procedures, proposals, methods and/or operational flowcharts disclosed herein. One or more processors 202a and 202b may generate messages, control information, data or information according to the descriptions, functions, procedures, proposals, methods and/or operational flowcharts disclosed herein. One or more processors 202a and 202b may generate PDUs. SDUs, messages, control information, data or information according to the functions, procedures, proposals and/or methods disclosed herein and provide the PDUs, SDUs, messages, control information, data or information to one or more transceivers 206a and 206b. One or more processors 202a and 202b may receive signals (e.g., baseband signals) from one or more transceivers 206a and 206b and acquire PDUs, SDUs, messages, control information, data or information according to the descriptions, functions, procedures, proposals, methods and/or operational flowcharts disclosed herein.

One or more processors 202a and 202b may be referred to as controllers, microcontrollers, microprocessors or microcomputers. One or more processors 202a and 202b may be implemented by hardware, firmware, software or a combination thereof. For example, one or more application specific integrated circuits (ASICs), one or more digital signal processors (DSPs), one or more digital signal processing devices (DSPDs), programmable logic devices (PLDs) or one or more field programmable gate arrays (FPGAs) may be included in one or more processors 202a and 202b. The descriptions, functions, procedures, proposals, methods and/or operational flowcharts disclosed herein may be implemented using firmware or software, and firmware or software may be implemented to include modules, procedures, functions, etc. Firmware or software configured to perform the descriptions, functions, procedures, proposals, methods and/or operational flowcharts disclosed herein may be included in one or more processors 202a and 202b or stored in one or more memories 204a and 204b to be driven by one or more processors 202a and 202b. The descriptions, functions, procedures, proposals, methods and/or operational flowcharts disclosed herein implemented using firmware or software in the form of code, a command and/or a set of commands.

One or more memories 204a and 204b may be connected with one or more processors 202a and 202b to store various types of data, signals, messages, information, programs, code, instructions and/or commands. One or more memories 204a and 204b may be composed of read only memories (ROMs), random access memories (RAMs), erasable programmable read only memories (EPROMs), flash memories, hard drives, registers, cache memories, computer-readable storage mediums and/or combinations thereof. One or more memories 204a and 204b may be located inside and/or outside one or more processors 202a and 202b. In addition, one or more memories 204a and 204b may be connected with one or more processors 202a and 202b through various technologies such as wired or wireless connection.

One or more transceivers 206a and 206b may transmit user data, control information, radio signals/channels, etc. described in the methods and/or operational flowcharts of the present disclosure to one or more other apparatuses. One or more transceivers 206a and 206b may receive user data, control information, radio signals/channels, etc. described in the methods and/or operational flowcharts of the present disclosure from one or more other apparatuses. For example, one or more transceivers 206a and 206b may be connected with one or more processors 202a and 202b to transmit/receive radio signals. For example, one or more processors 202a and 202b may perform control such that one or more transceivers 206a and 206b transmit user data, control information or radio signals to one or more other apparatuses. In addition, one or more processors 202a and 202b may perform control such that one or more transceivers 206a and 206b receive user data, control information or radio signals from one or more other apparatuses. In addition, one or more transceivers 206a and 206b may be connected with one or more antennas 208a and 208b, and one or more transceivers 206a and 206b may be configured to transmit/receive user data, control information, radio signals/channels, etc. described in the descriptions, functions, procedures, proposals, methods and/or operational flowcharts disclosed herein through one or more antennas 208*a* and 208*b*. In the present disclosure, one or more antennas may be a plurality of physical antennas or a plurality of logical antennas (e.g., antenna ports). One or more transceivers 206*a* and 206*b* may convert the received radio signals/channels, etc. from RF band signals to base-band signals, in order to process the received user data, control information, radio signals/channels, etc. using one or more processors 202*a* and 202*b*. One or more transceivers 206*a* and 206*b* may convert the user data, control informa-tion, radio signals/channels processed using one or more processors 202*a* and 202*b* from baseband signals into RF band signals. To this end, one or more transceivers 206*a* and 206*b* may include (analog) oscillator and/or filters.

Structure of Wireless Device Applicable to the Present Disclosure

Figure 3:
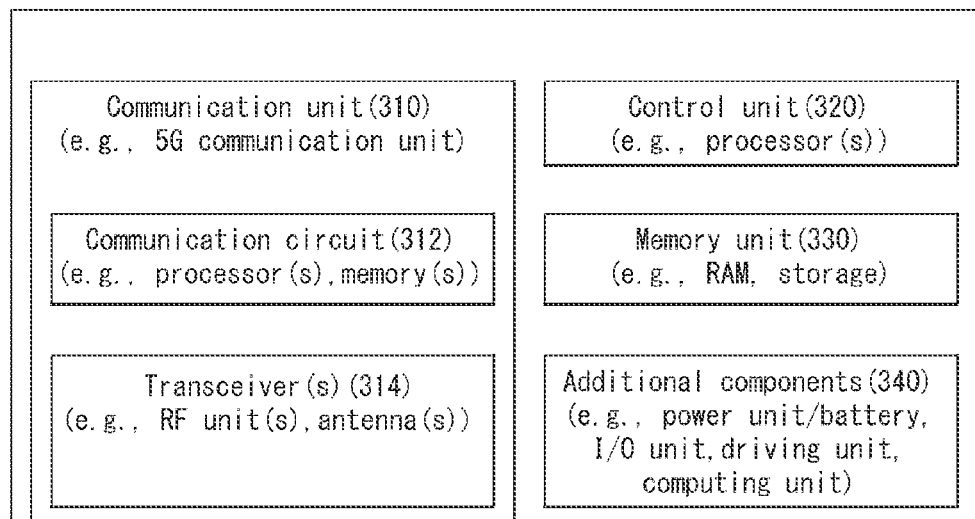
FIG. 3 is a view showing another example of a wireless device applicable to the present disclosure.

FIG. 3 illustrates another example of a wireless device applicable to the present disclosure.

Referring to FIG. 3, a wireless device 300 may corre-spond to the wireless devices 200*a* and 200*b* of FIG. 2 and include various elements, components, units/portions and/or modules. For example, the wireless device 300 may include a communication unit 310, a control unit (controller) 320, a memory unit (memory) 330 and additional components 340. The communication unit may include a communication circuit 312 and a transceiver(s) 314. For example, the communication circuit 312 may include one or more pro-cessors 202*a* and 202*b* and/or one or more memories 204*a* and 204*b* of FIG. 2. For example, the transceiver(s) 314 may include one or more transceivers 206*a* and 206*b* and/or one or more antennas 208*a* and 208*b* of FIG. 2. The control unit 320 may be electrically connected with the communication unit 310, the memory unit 330 and the additional compo-nents 340 to control overall operation of the wireless device. For example, the control unit 320 may control electrical/mechanical operation of the wireless device based on a program/code/instruction/information stored in the memory unit 330. In addition, the control unit 320 may transmit the information stored in the memory unit 330 to the outside (e.g., another communication device) through the wireless/wired interface using the communication unit 310 over a wireless/wired interface or store information received from the outside (e.g., another communication device) through the wireless/wired interface using the communication unit 310 in the memory unit 330.

The additional components 340 may be variously config-ured according to the types of the wireless devices. For example, the additional components 340 may include at least one of a power unit/battery, an input/output unit, a driving unit or a computing unit. Without being limited thereto, the wireless device 300 may be implemented in the form of the robot (FIG. 1, 100*a*), the vehicles (FIG. 1, 100*b*-1 and 100*b*-2), the XR device (FIG. 1, 100*c*), the hand-held device (FIG. 1, 100*d*), the home appliance (FIG. 1, 100*e*), the IoT device (FIG. 1, 100*f*), a digital broadcast terminal, a hologram apparatus, a public safety apparatus, an MTC apparatus, a medical apparatus, a Fintech device (financial device), a security device, a climate/environment device, an AI server/device (FIG. 1, 140), the base station (FIG. 1, 120), a network node, etc. The wireless device may be movable or may be used at a fixed place according to use example/service.

In FIG. 3, various elements, components, units/portions and/or modules in the wireless device 300 may be connected with each other through wired interfaces or at least some thereof may be wirelessly connected through the communication unit 310. For example, in the wireless device 300, the control unit 320 and the communication unit 310 may be connected by wire, and the control unit 320 and the first unit (e.g., 130 or 140) may be wirelessly connected through the communication unit 310. In addition, each element, com-ponent, unit/portion and/or module of the wireless device 300 may further include one or more elements. For example, the control unit 320 may be composed of a set of one or more processors. For example, the control unit 320 may be composed of a set of a communication control processor, an application processor, an electronic control unit (ECU), a graphic processing processor, a memory control processor, etc. In another example, the memory unit 330 may be composed of a random access memory (RAM), a dynamic RAM (DRAM), a read only memory (ROM), a flash memory, a volatile memory, a non-volatile memory and/or a combination thereof.

Hand-Held Device Applicable to the Present Disclosure

Figure 4:
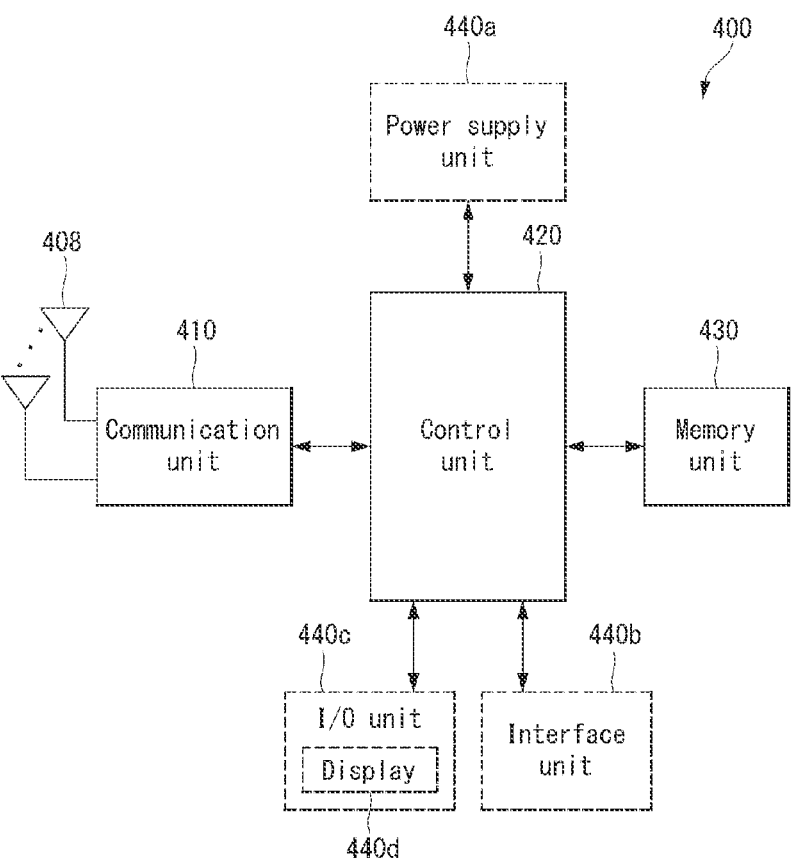
FIG. 4 is a view showing an example of a hand-held device applicable to the present disclosure.

FIG. 4 illustrates an example of a hand-held device applicable to the present disclosure.

FIG. 4 shows a hand-held device applicable to the present disclosure. The hand-held device may include a smartphone, a smart pad, a wearable device (e.g., a smart watch or smart glasses), and a hand-held computer (e.g., a laptop, etc.). The hand-held device may be referred to as a mobile station (MS), a user terminal (UT), a mobile subscriber station (MSS), a subscriber station (SS), an advanced mobile station (AMS) or a wireless terminal (WT).

Referring to FIG. 4, the hand-held device 400 may include an antenna unit (antenna) 408, a communication unit (transceiver) 410, a control unit (controller) 420, a memory unit (memory) 430, a power supply unit (power supply) 440*a*, an interface unit (interface) 440*b*, and an input/output unit 440*c*. An antenna unit (antenna) 408 may be part of the communication unit 410. The blocks 410 to 430/440*a* to 440*c* may correspond to the blocks 310 to 330/340 of FIG. 3, respectively.

The communication unit 410 may transmit and receive signals (e.g., data, control signals, etc.) to and from other wireless devices or base stations. The control unit 420 may control the components of the hand-held device 400 to perform various operations. The control unit 420 may include an application processor (AP). The memory unit 430 may store data/parameters/program/code/instructions neces-sary to drive the hand-held device 400. In addition, the memory unit 430 may store input/output data/information, etc. The power supply unit 440*a* may supply power to the hand-held device 400 and include a wired/wireless charging circuit, a battery, etc. The interface unit 440*b* may support connection between the hand-held device 400 and another external device. The interface unit 440*b* may include various ports (e.g., an audio input/output port and a video input/output port) for connection with the external device. The input/output unit 440*c* may receive or output video infor-mation/signals, audio information/signals, data and/or user input information. The input/output unit 440*c* may include a camera, a microphone, a user input unit, a display 440*d*, a speaker and/or a haptic module.

For example, in case of data communication, the input/output unit 440*c* may acquire user input information/signal (e.g., touch, text, voice, image or video) from the user and store the user input information/signal in the memory unit 430. The communication unit 410 may convert the infor-mation/signal stored in the memory into a radio signal and transmit the converted radio signal to another wireless device directly or transmit the converted radio signal to a base station. In addition, the communication unit 410 may receive a radio signal from another wireless device or the base station and then restore the received radio signal into original information/signal. The restored information/signal may be stored in the memory unit 430 and then output through the input/output unit 440c in various forms (e.g., text, voice, image, video and haptic).

Physical Channels and General Signal Transmission

In a radio access system, a UE receives information from a base station on a DL and transmits information to the base station on a UL. The information transmitted and received between the UE and the base station includes general data information and a variety of control information. There are many physical channels according to the types/usages of information transmitted and received between the base station and the UE.

Figure 5:
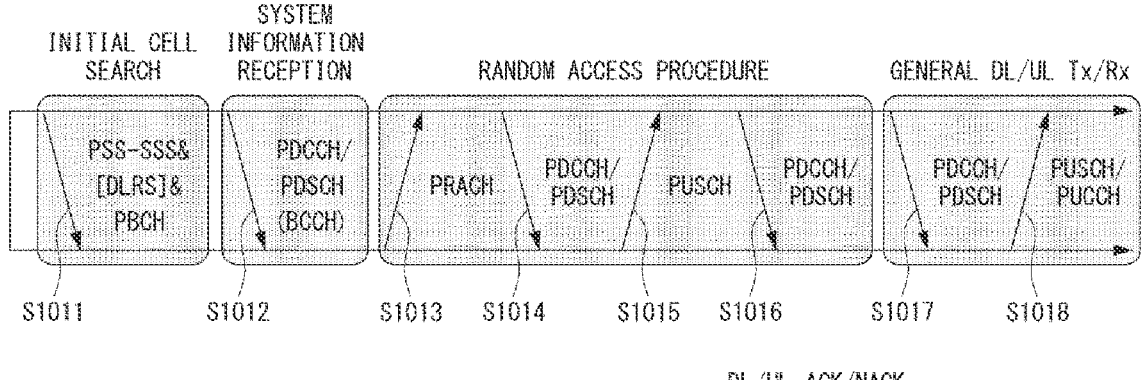
FIG. 5 is a view showing physical channels applicable to the present disclosure and a signal transmission method using the same.

FIG. 5 illustrates physical channels applicable to the present disclosure and a signal transmission method using the same.

The UE which is turned on again in a state of being turned off or has newly entered a cell performs initial cell search operation in step S1011 such as acquisition of synchronization with a base station. Specifically, the UE performs synchronization with the base station, by receiving a Primary Synchronization Channel (P-SCH) and a Secondary Synchronization Channel (S-SCH) from the base station, and acquires information such as a cell Identifier (ID).

Thereafter, the UE may receive a physical broadcast channel (PBCH) signal from the base station and acquire intra-cell broadcast information. Meanwhile, the UE may receive a downlink reference signal (DL RS) in an initial cell search step and check a downlink channel state. The UE which has completed initial cell search may receive a physical downlink control channel (PDCCH) and a physical downlink control channel (PDSCH) according to physical downlink control channel information in step S1012, thereby acquiring more detailed system information.

Thereafter, the UE may perform a random access procedure such as steps S1013 to S1016 in order to complete access to the base station. To this end, the UE may transmit a preamble through a physical random access channel (PRACH) (S1013) and receive a random access response (RAR) to the preamble through a physical downlink control channel and a physical downlink shared channel corresponding thereto (S1014). The UE may transmit a physical uplink shared channel (PUSCH) using scheduling information in the RAR (S1015) and perform a contention resolution procedure such as reception of a physical downlink control channel signal and a physical downlink shared channel signal corresponding thereto (S1016).

The UE, which has performed the above-described procedures, may perform reception of a physical downlink control channel signal and/or a physical downlink shared channel signal (S1017) and transmission of a physical uplink shared channel (PUSCH) signal and/or a physical uplink control channel (PUCCH) signal (S1018) as general uplink/downlink signal transmission procedures.

The control information transmitted from the UE to the base station is collectively referred to as uplink control information (UCI). The UCI includes hybrid automatic repeat and request acknowledgement/negative-ACK (HARQ-ACK/NACK), scheduling request (SR), channel quality indication (CQI), precoding matrix indication (PMI), rank indication (RI), beam indication (BI) information, etc. At this time, the UCI is generally periodically transmitted through a PUCCH, but may be transmitted through a PUSCH in some embodiments (e.g., when control information and traffic data are simultaneously transmitted). In addition, the UE may aperiodically transmit UCI through a PUSCH according to a request/instruction of a network.

Figure 6:
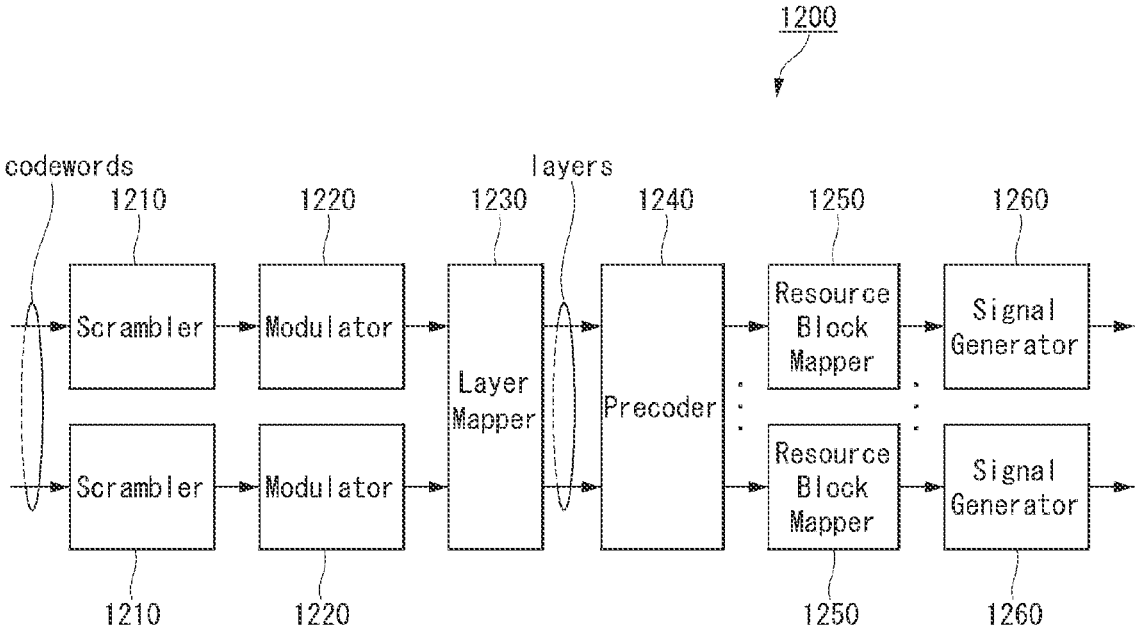
FIG. 6 is a view showing a method of processing a transmitted signal applicable to the present disclosure.

FIG. 6 illustrates a method of processing a transmitted signal applicable to the present disclosure. For example, the transmitted signal may be processed by a signal processing circuit. At this time, a signal processing circuit 1200 may include a scrambler 1210, a modulator 1220, a layer mapper 1230, a precoder 1240, a resource mapper 1250, and a signal generator 1260. At this time, for example, the operation/function of FIG. 6 may be performed by the processors 202a and 202b and/or the transceiver 206a and 206b of FIG. 2. In addition, for example, the hardware element of FIG. 6 may be implemented in the processors 202a and 202b of FIG. 2 and/or the transceivers 206a and 206b of FIG. 2. For example, blocks 1010 to 1060 may be implemented in the processors 202a and 202b of FIG. 2. In addition, blocks 1210 to 1250 may be implemented in the processors 202a and 202b of FIG. 2 and a block 1260 may be implemented in the transceivers 206a and 206b of FIG. 2, without being limited to the above-described embodiments.

A codeword may be converted into a radio signal through the signal processing circuit 1200 of FIG. 6. Here, the codeword is a coded bit sequence of an information block. The information block may include a transport block (e.g., a UL-SCH transport block or a DL-SCH transport block). The radio signal may be transmitted through various physical channels (e.g., a PUSCH and a PDSCH) of FIG. 5. Specifically, the codeword may be converted into a bit sequence scrambled by the scrambler 1210. The scramble sequence used for scramble is generated based in an initial value and the initial value may include ID information of a wireless device, etc. The scrambled bit sequence may be modulated into a modulated symbol sequence by the modulator 1220. The modulation method may include pi/2-binary phase shift keying (pi/2-BPSK), m-phase shift keying (m-PSK), m-quadrature amplitude modulation (m-QAM), etc.

A complex modulation symbol sequence may be mapped to one or more transport layer by the layer mapper 1230. Modulation symbols of each transport layer may be mapped to corresponding antenna port(s) by the precoder 1240 (precoding). The output z of the precoder 1240 may be obtained by multiplying the output y of the layer mapper 1230 by an N*M precoding matrix W. Here, N may be the number of antenna ports and M may be the number of transport layers. Here, the precoder 1240 may perform precoding after transform precoding (e.g., discrete Fourier transform (DFT)) for complex modulation symbols. In addition, the precoder 1240 may perform precoding without performing transform precoding.

The resource mapper 1250 may map modulation symbols of each antenna port to time-frequency resources. The time-frequency resources may include a plurality of symbols (e.g., a CP-OFDMA symbol and a DFT-s-OFDMA symbol) in the time domain and include a plurality of subcarriers in the frequency domain. The signal generator 1260 may generate a radio signal from the mapped modulation symbols, and the generated radio signal may be transmitted to another device through each antenna. To this end, the signal generator 1260 may include an inverse fast Fourier transform (IFFT) module, a cyclic prefix (CP) insertor, a digital-to-analog converter (DAC), a frequency uplink converter, etc.

A signal processing procedure for a received signal in the wireless device may be configured as the inverse of the signal processing procedures 1210 to 1260 of FIG. 6. For example, the wireless device (e.g., 200a or 200b of FIG. 2)

may receive a radio signal from the outside through an antenna port/transceiver. The received radio signal may be converted into a baseband signal through a signal restorer. To this end, the signal restorer may include a frequency downlink converter, an analog-to-digital converter (ADC), a CP remover, and a fast Fourier transform (FFT) module. Thereafter, the baseband signal may be restored to a codeword through a resource de-mapper process, a postcoding process, a demodulation process and a de-scrambling process. The codeword may be restored to an original information block through decoding. Accordingly, a signal processing circuit (not shown) for a received signal may include a signal restorer, a resource de-mapper, a postcoder, a demodulator, a de-scrambler and a decoder.

Figure 7:
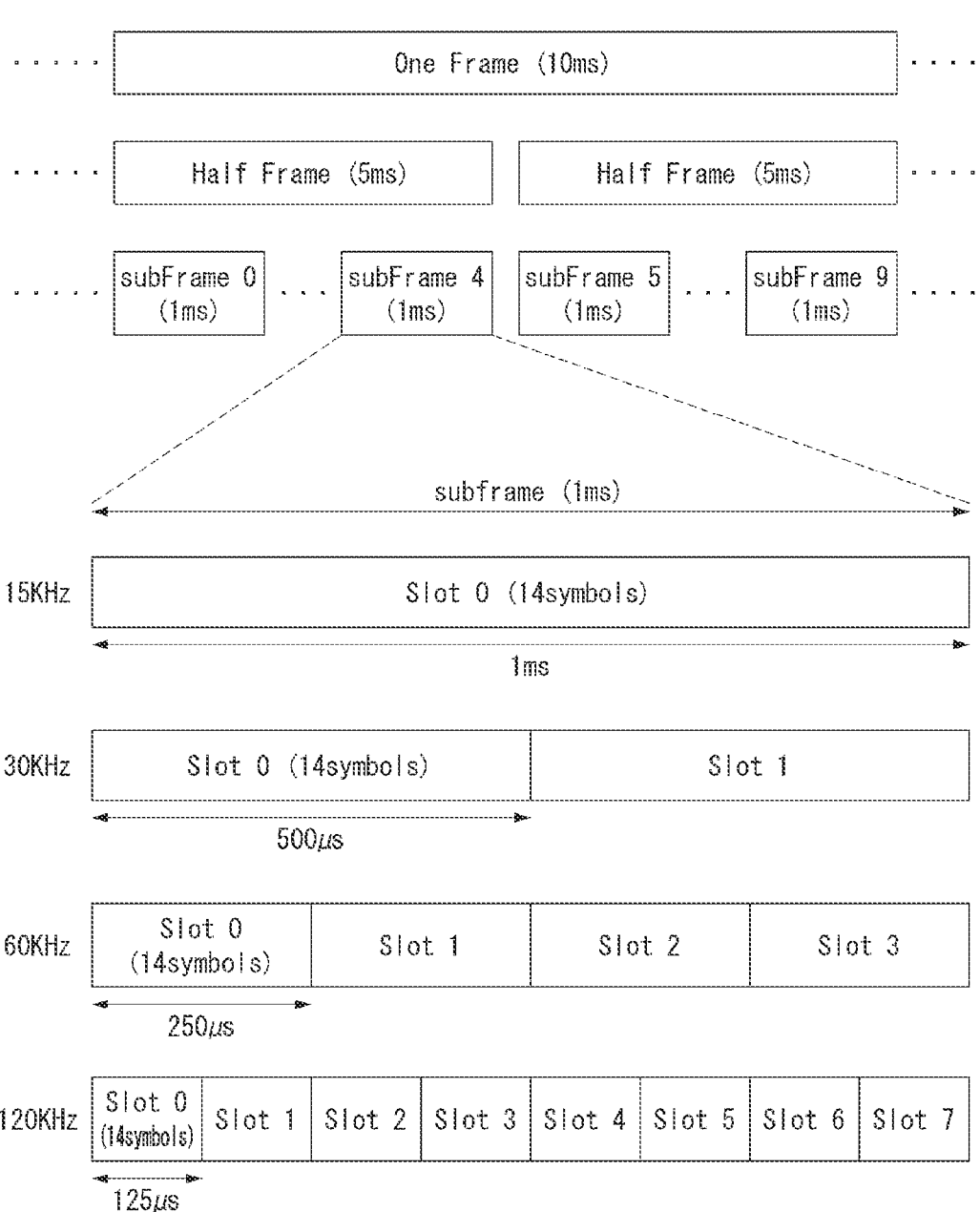
FIG. 7 is a view showing the structure of a radio frame applicable to the present disclosure.

FIG. 7 illustrates the structure of a radio frame applicable to the present disclosure.

UL and DL transmission based on an NR system may be based on the frame shown in FIG. 7. At this time, one radio frame has a length of 10 ms and may be defined as two 5-ms half-frames (HFs). One half-frame may be defined as five 1-ms subframes (SFs). One subframe may be divided into one or more slots and the number of slots in the subframe may depend on subscriber spacing (SCS). At this time, each slot may include 12 or 14 OFDM(A) symbols according to cyclic prefix (CP). If normal CP is used, each slot may include 14 symbols. If an extended CP is used, each slot may include 12 symbols. Here, the symbol may include an OFDM symbol (or a CP-OFDM symbol) and an SC-FDMA symbol (or a DFT-s-OFDM symbol).

Table 1 shows the number of symbols per slot according to SCS, the number of slots per frame and the number of slots per subframe when normal CP is used, and Table 2 shows the number of symbols per slot according to SCS, the number of slots per frame and the number of slots per subframe when extended CP is used.

TABLE 1

| μ | $N_{symb}^{slot}$ | $N_{slot}^{frame,\mu}$ | $N_{slot}^{subframe,\mu}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |
| 5 | 14 | 320 | 32 |

TABLE 2

| μ | $N_{symb}^{slot}$ | $N_{slot}^{frame,\mu}$ | $N_{slot}^{subframe,\mu}$ |
|---|---|---|---|
| 2 | 12 | 40 | 4 |

In Tables 1 and 2 above, Nslotsymb may indicate the number of symbols in a slot, Nframe,μslot may indicate the number of slots in a frame, and Nsubframe,μslot may indicate the number of slots in a subframe.

In addition, in a system, to which the present disclosure is applicable, OFDM(A) numerology (e.g., SCS, CP length, etc.) may be differently set among a plurality of cells merged to one UE. Accordingly, an (absolute time) period of a time resource (e.g., an SF, a slot or a TTI) (for convenience, collectively referred to as a time unit (TU)) composed of the same number of symbols may be differently set between merged cells.

NR may support a plurality of numerologies (or subscriber spacings (SCSs)) supporting various 5G services. For example, a wide area in traditional cellular bands is supported when the SCS is 15 kHz, dense-urban, lower latency and wider carrier bandwidth are supported when the SCS is 30 kHz/60 kHz, and bandwidth greater than 24.25 GHz may be supported to overcome phase noise when the SCS is 60 kHz or higher.

An NR frequency band is defined as two types (FR1 and FR2) of frequency ranges. FR1 and FR2 may be configured as shown in the following table. In addition, FR2 may mean millimeter wave (mmW).

TABLE 3

| Frequency Range designation | Corresponding frequency range | Subcarrier Spacing |
|---|---|---|
| FR1 | 410 MHz-7125 MHz | 15, 30, 60 kHz |
| FR2 | 24250 MHz-52600 MHz | 60, 120, 240 kHz |

In addition, for example, in a communication system, to which the present disclosure is applicable, the above-described numerology may be differently set. For example, a terahertz wave (THz) band may be used as a frequency band higher than FR2. In the THz band, the SCS may be set greater than that of the NR system, and the number of slots may be differently set, without being limited to the above-described embodiments. The THz band will be described below.

Figure 8:
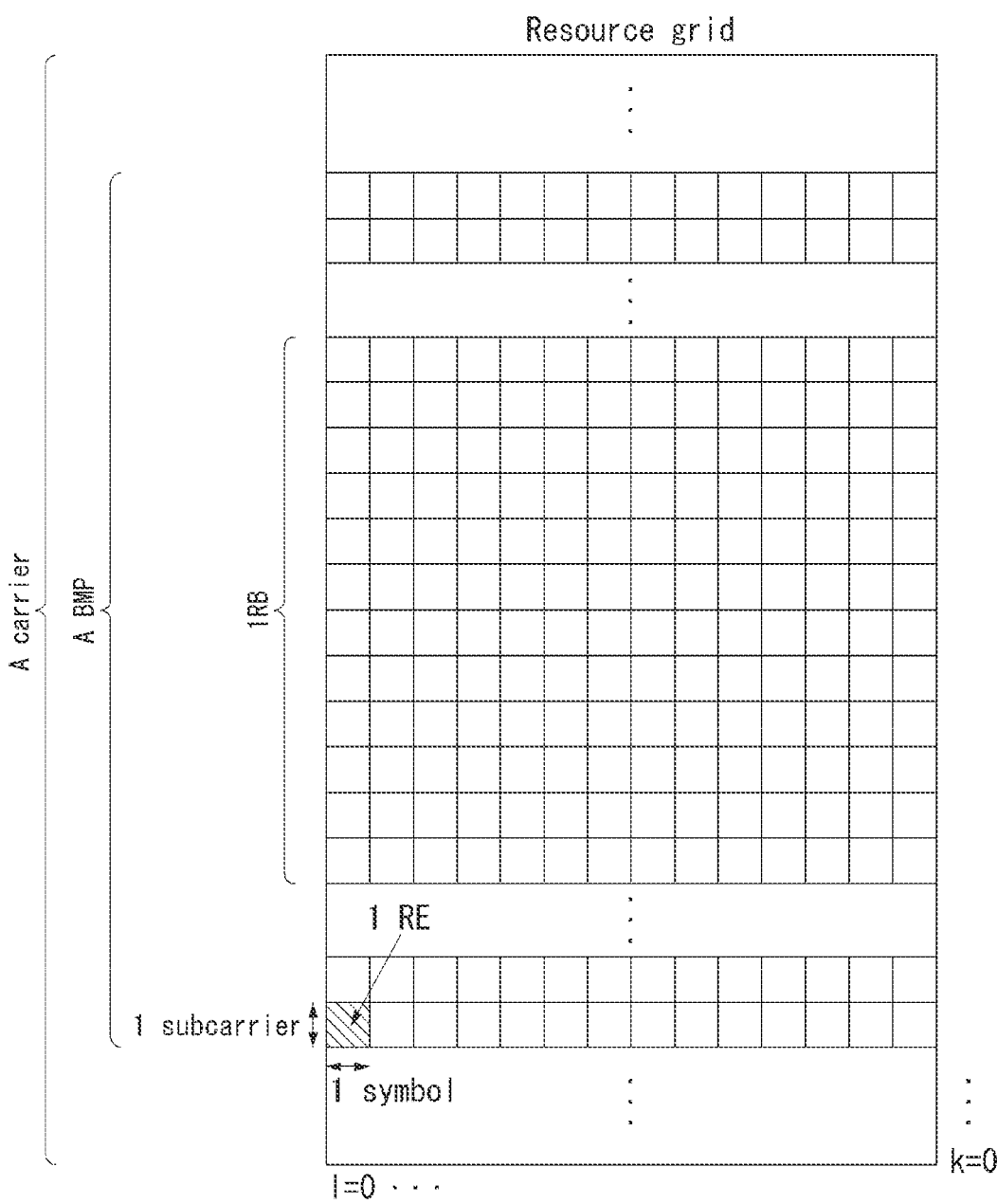
FIG. 8 is a view showing a slot structure applicable to the present disclosure.

FIG. 8 illustrates a slot structure applicable to the present disclosure.

One slot includes a plurality of symbols in the time domain. For example, one slot includes seven symbols in case of normal CP and one slot includes six symbols in case of extended CP. A carrier includes a plurality of subcarriers in the frequency domain. A resource block (RB) may be defined as a plurality (e.g., 12) of consecutive subcarriers in the frequency domain.

In addition, a bandwidth part (BWP) is defined as a plurality of consecutive (P)RBs in the frequency domain and may correspond to one numerology (e.g., SCS, CP length, etc.).

The carrier may include a maximum of N (e.g., five) BWPs. Data communication is performed through an activated BWP and only one BWP may be activated for one UE. In resource grid, each element is referred to as a resource element (RE) and one complex symbol may be mapped.

6G Communication System

A 6G (wireless communication) system has purposes such as (i) very high data rate per device, (ii) a very large number of connected devices, (iii) global connectivity. (iv) very low latency, (v) decrease in energy consumption of battery-free IoT devices, (vi) ultra-reliable connectivity, and (vii) connected intelligence with machine learning capacity. The vision of the 6G system may include four aspects such as "intelligent connectivity", "deep connectivity", "holographic connectivity" and "ubiquitous connectivity", and the 6G system may satisfy the requirements shown in Table 4 below. That is, Table 4 shows the requirements of the 6G system.

TABLE 4

| Per device peak data rate | 1 Tbps |
|---|---|
| E2E latency | 1 ms |
| Maximum spectral efficiency | 100 bps/Hz |

TABLE 4-continued

| Mobility support | Up to 1000 km/hr |
| Satellite integration | Fully |
| AI | Fully |
| Autonomous vehicle | Fully |
| XR | Fully |
| Haptic Communication | Fully |

At this time, the 6G system may have key factors such as enhanced mobile broadband (eMBB), ultra-reliable low latency communications (URLLC), massive machine type communications (mMTC), AI integrated communication, tactile Internet, high throughput, high network capacity, high energy efficiency, low backhaul and access network congestion and enhanced data security.

Figure 9:
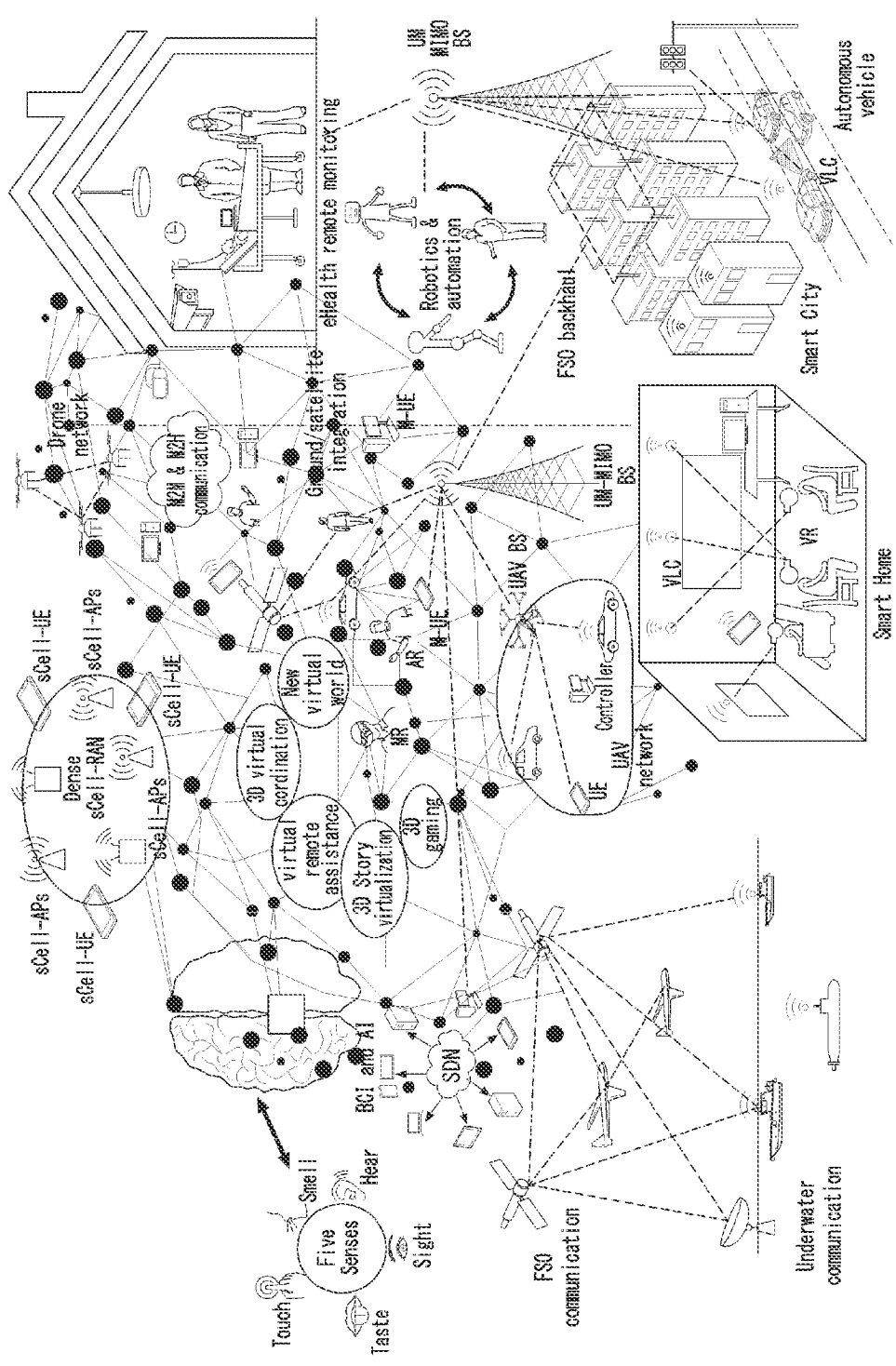
FIG. 9 is a view showing an example of a communication structure providable in a 6G system applicable to the present disclosure.

FIG. 9 illustrates an example of a communication structure providable in a 6G system applicable to the present disclosure.

Referring to FIG. 9, the 6G system will have 50 times higher simultaneous wireless communication connectivity than a 5G wireless communication system. URLLC, which is the key feature of 5G, will become more important technology by providing end-to-end latency less than 1 ms in 6G communication. At this time, the 6G system may have much better volumetric spectrum efficiency unlike frequently used domain spectrum efficiency. The 6G system may provide advanced battery technology for energy harvesting and very long battery life and thus mobile devices may not need to be separately charged in the 6G system. In addition, in 6G, new network characteristics may be as follows.

Satellites integrated network: To provide a global mobile group, 6G will be integrated with satellite. Integrating terrestrial waves, satellites and public networks as one wireless communication system may be very important for 6G.

Connected intelligence: Unlike the wireless communication systems of previous generations, 6G is innovative and wireless evolution may be updated from "connected things" to "connected intelligence". AI may be applied in each step (or each signal processing procedure which will be described below) of a communication procedure.

Seamless integration of wireless information and energy transfer: A 6G wireless network may transfer power in order to charge the batteries of devices such as smartphones and sensors. Therefore, wireless information and energy transfer (WIET) will be integrated.

Ubiquitous super 3-dimension connectivity: Access to networks and core network functions of drones and very low earth orbit satellites will establish super 3D connection in 6G ubiquitous.

In the new network characteristics of 6G, several general requirements may be as follows.

Small cell networks: The idea of a small cell network was introduced in order to improve received signal quality as a result of throughput, energy efficiency and spectrum efficiency improvement in a cellular system. As a result, the small cell network is an essential feature for 5G and beyond 5G (5 GB) communication systems. Accordingly, the 6G communication system also employs the characteristics of the small cell network.

Ultra-dense heterogeneous network: Ultra-dense heterogeneous networks will be another important characteristic of the 6G communication system. A multi-tier network composed of heterogeneous networks improves overall QoS and reduce costs.

High-capacity backhaul: Backhaul connection is characterized by a high-capacity backhaul network in order to support high-capacity traffic. A high-speed optical fiber and free space optical (FSO) system may be a possible solution for this problem.

Radar technology integrated with mobile technology: High-precision localization (or location-based service) through communication is one of the functions of the 6G wireless communication system. Accordingly, the radar system will be integrated with the 6G network.

Softwarization and virtualization: Softwarization and virtualization are two important functions which are the bases of a design process in a 5 GB network in order to ensure flexibility, reconfigurability and programmability.

The contents discussed above may be applied in combination with the methods proposed in the present disclosure, which will be described later, or may be supplemented to clarify the technical features of the methods proposed in the present disclosure. The methods described below are divided for convenience of explanation, and it goes without saying that some components of one method may be replaced with some components of another method or may be applied in combination with each other.

Polar Code

Polar code is a code that can obtain channel capacity in a binary-input discrete memoryless channel (B-DMC). In other words, the polar code is a code that can obtain channel capacity by infinitely increasing N, the size of the code block. Here, 'obtaining channel capacity' may mean separating channels without noise and channels with noise. Polar code encoder consists of two processes: channel combining and channel splitting.

Channel combining is a process of determining the size of a code block by concatenating binary-input discrete memoryless channels (B-DMC) in parallel.

Figure 10:
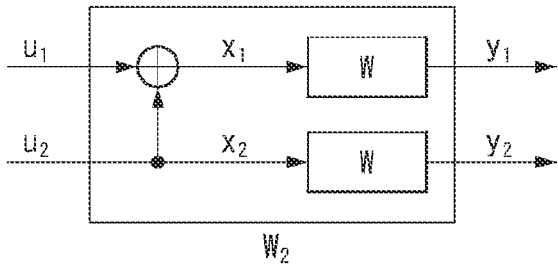
FIG. 10 is a diagram illustrating 1st level channel combining for polar coding according to an embodiment of the present disclosure.

FIG. 10 is a diagram illustrating 1st level channel combining for polar coding according to an embodiment of the present disclosure.

Referring to FIG. 10, two binary-input discrete memoryless channels (B-DMC) (W) are combined. Here, u1 and u2 are binary-input source bits and y1 and y2 are output coded bits. At this time, the entire equivalent channel is assumed to be W2. When N binary-input discrete memoryless channels (B-DMC) are combined, each channel can be expressed in a recursive form. That is, when $$x_1^N = u_1^N G_N, \ x_1^N = \{x_1, \ \ldots \ , x_N\}, \ \text{and} \ u_1^N = \{u_1, \ \ldots \ , u_N\},$$

GN, which is a generator matrix, can be calculated as in Equation 1 below.

$$G_N = B_N F^{\otimes n}, \qquad \text{[Equation 1]}$$

$$N = 2^n,$$

$$F = \begin{bmatrix} 1 & 0 \\ 1 & 1 \end{bmatrix},$$

-continued $$F^{\otimes n} = F \otimes F^{\otimes(n-1)},$$

$$F^{\otimes 0} = 1,$$

$$B_N = R_N\left(I_2 \otimes B_{\frac{N}{2}}\right)$$

In Equation 1, R_N represents a bit-reversal interleaver, and maps the input $$s_1^N$$

to become the output $$x_1^N = (s_1, s_3, \ldots, s_{N-1}, s_2, \ldots, s_N).$$

Figure 11:
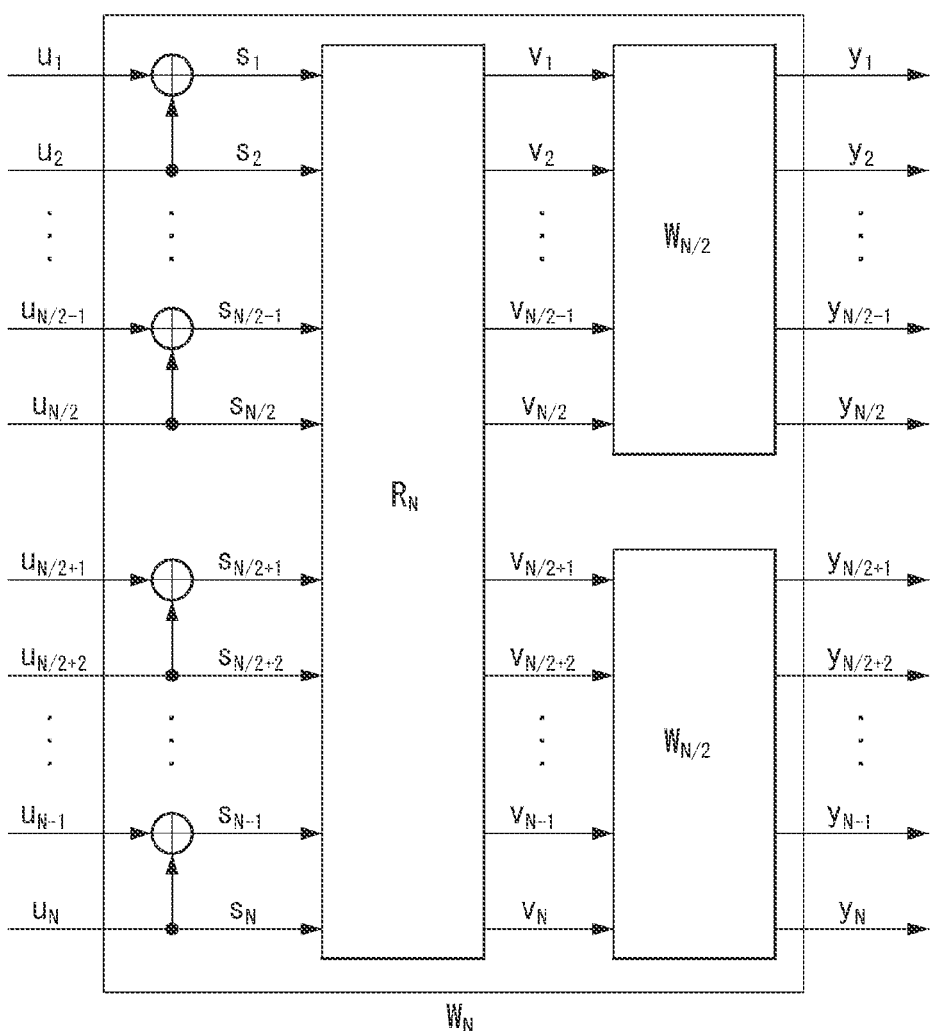
FIG. 11 is a diagram illustrating N-th level channel combining for polar coding according to an embodiment of the present disclosure.

This relationship is shown in FIG. 11.

FIG. 11 is a diagram illustrating N-th level channel combining for polar coding according to an embodiment of the present disclosure. Referring to FIG. 11, N, which is the size of a code block, may be limited to have a value of $2^N$ (where n is a natural number).

The process of combining N binary-input discrete memoryless channels (B-DMC) and then defining an equivalent channel for a specific input is called channel splitting. This can be expressed as channel transition probability as shown in Equation 2 below.

$$W_N^{(i)}\left(y_1^N, u_1^{i-1} \mid u_i\right) = \sum_{u_{i+1}^N} \frac{1}{2^{N-1}} W_N\left(y_1^N \mid u_1^N\right) \qquad \text{[Equation 2]}$$

When channel combining and channel splitting are performed, the following theorem can be defined.

For any binary-input discrete memoryless channel (B-DMC) W, the corresponding channels $$\left\{W_N^{(i)}\right\}$$

are polarized in the following perspectives. Specifically, $$\left\{W_N^{(i)}\right\}$$

is polarized for a fixed $\delta \in (0, 1)$ based on the following i) and ii).
   i) N becomes infinity through the square of 2
   ii) The fraction of indices $$i \in \{1, \ldots, N\} \text{ for which } I\left(W_N^{(i)}\right) \in (1 - \delta, 1]$$

becomes I(W), and the fraction for which $$I\left(W_N^{(i)}\right) \in [0, \delta)$$

becomes 1−1(W)

Therefore, as N goes to infinity, the channels are polarized to be either completely noisy or noisy free. Since the transmitter side accurately knows the polarized channels, bad channels can be corrected and uncoded bits can be transmitted through good channels.

That is, when the size N of the code block becomes infinite, the equivalent channel for a specific input bit may be classified as a noisy channel or a noise-free channel. This means that the capacity of the equivalent channel for a specific input bit is classified as 0 or I(W) (capacity of channel W).

The decoding method for this polar code is successive cancellation decoding (SC decoding) method. The successive cancellation decoding (SC decoding) method is a method of obtaining the channel transition probability and calculating the likelihood ratio (LLR) for the input bit. At this time, the channel transition probability can be calculated in a recursive form using the characteristic that the channel combining process and the channel splitting process are performed in a recursive form.

Therefore, the final likelihood ratio (LLR) value can also be calculated in a recursive form. First, $$W_N^{(i)}\left(y_1^N, u_1^{i-1} \mid u_i\right),$$

which is the channel transition probability for the input bit ui, can be calculated based on Equation 3 and Equation 4 below.

$$u_1^i$$

is divided into odd index and even index, and each can be expressed as $$u_{1,o}^i, u_{1,e}^i.$$

$$W_{2N}^{(2i-1)}\left(y_1^{2N}, u_1^{2i-2} \mid u_{2i-1}\right) = \qquad \text{[Equation 3]}$$

$$\sum_{u_{2i}^{2N}} \frac{1}{2^{2N-1}} W_{2N}\left(y_1^{2N} \mid u_1^{2N}\right) = \sum_{u_{2i,o}^{2N}, u_{2i,e}^{2N}} \frac{1}{2^{2N-1}}$$

$$W_N\left(y_1^N \mid u_{1,o}^{2N} \oplus u_{1,e}^{2N}\right) W_N\left(y_{N+1}^{2N} \mid u_{1,e}^{2N}\right) \sum_{u_{2i}} \frac{1}{2} \sum_{u_{2i+1,e}^{2N}} \frac{1}{2^{N-1}}$$

$$W_N\left(y_{N+1}^{2N} \mid u_{1,e}^{2N}\right) \cdot \sum_{u_{2i+1,o}^{2N}} \frac{1}{2^{N-1}} W_N\left(y_1^N \mid u_{1,o}^{2N} \oplus u_{1,e}^{2N}\right) = \sum_{u_{2i}} \frac{1}{2}$$

$$W_N^{(i)}\left(y_1^N, u_{1,o}^{2i-2} \oplus u_{1,e}^{2i-2} \mid u_{2i-1} \oplus u_{2i}\right) \cdot W_N^{(i)}\left(y_{N+1}^{2N}, u_{1,e}^{2i-2} \mid u_{2i}\right) \text{ using}$$

$$\text{the definition of } W_N^{(i)}\left(y_1^N, u_1^{i-1} \mid u_i\right) = \sum_{u_{i+1}^N} \frac{1}{2^{N-1}} W_N\left(y_1^N \mid u_1^N\right)$$

$$W_{2N}^{(2i-1)}\left(y_1^{2N}, u_1^{2i-1} \mid u_{2i}\right) = \qquad \text{[Equation 4]}$$

$$\sum_{u_{2i+1}^{2N}} \frac{1}{2^{2N-1}} W_{2N}\left(y_1^{2N} \mid u_1^{2N}\right) = \sum_{u_{2i+1,o}^{2N}, u_{2i+1,e}^{2N}} \frac{1}{2^{2N-1}}$$

$$W_N\left(y_1^N \mid u_{1,o}^{2N} \oplus u_{1,e}^{2N}\right) W_N\left(y_{N+1}^{2N} \mid u_{1,e}^{2N}\right) = \frac{1}{2} \sum_{u_{2i+1,e}^{2N}} \frac{1}{2^{N-1}}$$

-continued $$W_N\left(y_{N+1}^{2N}\middle|u_{1,e}^{2N}\right)\cdot\sum_{u_{2i+1,o}^{2N}}\frac{1}{2^{N-1}}W_N\left(y_1^N\middle|u_{1,o}^{2N}\oplus u_{1,e}^{2N}\right)=$$

$$\frac{1}{2}W_N^{(i)}\left(y_1^N,u_{1,o}^{2i-2}\oplus u_{1,e}^{2i-2}\middle|u_{2i-1}\oplus u_{2i}\right)\cdot W_N^{(i)}\left(y_{N+1}^{2N},u_{1,e}^{2i-2}\middle|u_{2i}\right)$$

At this time, $$L_N^{(i)}=\frac{w_N^{(i)}\left(y_1^N,\hat{u}_1^{i-1}\mid 0\right)}{w_N^{(i)}\left(y_1^N,\hat{u}_1^{i-1}\mid 1\right)},$$

which is LLR, can be calculated based on the following Equation 5 and Equation 6.

$$L_N^{(2i-1)}\left(y_1^N,\hat{u}_1^{2i-2}\right)=\qquad\text{[Equation 5]}$$

$$\frac{L_{N/2}^{(i)}\left(y_1^{N/2},\hat{u}_{1,o}^{2i-2}\oplus\hat{u}_{1,e}^{2i-2}\right)L_{N/2}^{(i)}\left(y_{\frac{N}{2}+1}^N,\hat{u}_{1,e}^{2i-2}\right)+1}{L_{N/2}^{(i)}\left(y_1^{N/2},\hat{u}_{1,o}^{2i-2}\oplus\hat{u}_{1,e}^{2i-1}\right)+L_{N/2}^{(i)}\left(y_{\frac{N}{2}+1}^N,\hat{u}_{1,e}^{2i-2}\right)}$$

$$L_N^{(2i)}\left(y_1^N,\hat{u}_1^{2i-1}\right)=\qquad\text{[Equation 6]}$$

$$\left[L_{N/2}^{(i)},\hat{u}_{1,o}^{2i-2}\oplus\hat{u}_{1,e}^{2i-2}\right)\right]^{1-2\hat{u}_{2i-1}}\cdot L_{N/2}^{(i)}\left(y_{\frac{N}{2}+1}^N,\hat{u}_{1,e}^{2i-2}\right)$$

The complexity of a polar encoder and SC decoder depends on the code block length N. As an example, the complexity can be expressed as O(N log N).

Assuming K bits of input bits in a polar code of length N, the coding rate becomes K/N. At this time, when the generator matrix of the polar encoder with data payload size N is $G_N$, the following can be assumed.

The encoded bit can be expressed as $$x_1^N=u_1^N G_N.$$

K bits among $$u_1^N$$

correspond to payload bits. The row index of $G_N$ corresponding to the payload bit is assumed to be I, and the row index of $G_N$ corresponding to the remaining N–K bits is assumed to be F.

The minimum distance of the above polar code can be defined as in Equation 7 below.

$$d_{min}(C)=\min_{i\in I}2^{wt(i)}\qquad\text{[Equation 7]}$$

In Equation 7 above, wt(i) means the number of ones in the binary expansion of i, i=0, 1, . . . , N–1.

As described previously, through the process of channel combining and channel splitting, equivalent channels are divided into noisy channels and noise free channels, and the data payload must be transmitted on noise free channels.

That is, in terms of communication performance, the data payload must be transmitted on a noise-free equivalent channel. At this time, a method of finding a noise-free equivalent channel can be determined by obtaining Z(W)=Σ $\sqrt{W(y|0)W(y|1)}$ value of the equivalent channel for each input bit. The Z(W) is a Battacharyya parameter. The Battacharyya parameter is a value corresponding to the upper-bound of the error probability related to Maximum A Posteriori decision (MAP decision) when a binary input of 0 or 1 is transmitted. Maximum a posteriori (MAP) refers to the mode of posterior probability in Bayesian statistics.

Accordingly, once the Z(W) value is calculated, the channel(s) for transmitting the data payload can be selected by arranging the values in ascending order (smallest to largest). In the embodiments described later in the present disclosure, a reliability value of a bit channel index of the polar encoder can be expressed as Z(W).

Z(W) can be calculated based on Equation 8 below for a binary erasure channel (BEC).

$$Z\left(W_N^{(i)}\right)=Z\left(W_{(b_1,b_2,\ldots,b_{k-1})}\right)=\qquad\text{[Equation 8]}$$

$$\begin{cases}2Z\left(W_{(b_1,b_2,\ldots,b_{k-1})}\right)-Z\left(W_{(b_1,b_2,\ldots,b_{k-1})}\right)^2,\text{ if }b_k=0\\Z\left(W_{(b_1,b_2,\ldots,b_{k-1})}\right)^2,\text{ if }b_K=1\end{cases}$$

Using Equation 8 above, the Z(W) value that the erasure probability of the binary erasure channel (BEC) is 0.5 and the size of the code block is 8 is calculated as follows.

$$Z(W)=\{1.00,0.68,0.81,0.12,0.88,0.19,0.32,0.00\}$$

Therefore, when the size of the data payload is 2, the data payload can be transmitted on the 8th equivalent channel (Z(W)=0.00) and the 4th equivalent channel (Z(W)=0.12).

Polar Code in NR Standard

First, information bit allocation is examined in detail.

As described above, a reliability is different depending on the position of the input of the polar encoder. As an example, the reliability may mean the Z(W) value.

Polar encoding may be performed as follows.

The corresponding data blocks are allocated to a bit channel in order of the reliability depending on the size of the data block, and all others are configured as frozen (e.g. value of '0').

In more detail, assuming that the mother code size of the polar encoder is N, and a data block size is K, the polar encoding can be performed as follows. Data blocks are arranged in K bit channels in order of the reliability, and N–K bit channels are configured as 0.

In the present disclosure, the arrangement of the data block/data bit on the bit channel may be expressed as the allocation of a bit channel on the data block/data bit. The data bit (u3) in 18c of FIG. 18 described later will be described as a specific example. The above example can be expressed as 1) or 2) below.

1) data bit (e.g. u3) is arranged at bit channel index 31 and bit channel index 60

2) bit channel index 31 and bit channel index 60 are allocated to data bit (e.g. u3)

Table 5 below illustrates the bit channel index according to the reliability order when the maximum mother code size is 1024. If the mother code size is less than 1024, a bit channel index can be configured according to the reliability by using the nested method, which removes bit channel indices greater than the corresponding mother code size.

Here, the polar sequence is $$Q_0^{N_{max}-1} = \left\{ Q_0^{N_{max}}, Q_1^{N_{max}}, \dots, Q_{N_{max}-1}^{N_{max}} \right\}, 0 \le Q_i^{N_{max}} \le N_{max} - 1$$

represents the bit channel index of the polar encoder, and $$i = 0, 1, \dots, N_{max} - 1 \text{ and } N_{max} = 1024. \ W\left(Q_i^{N_{max}}\right),$$

which indicates the reliability of the bit channel index, satisfies $$W\left(Q_0^{N_{max}}\right) < W\left(Q_1^{N_{max}}\right) < \ \dots \ < W\left(Q_{N_{max}-1}^{N_{max}}\right).$$

TABLE 5

| $W\left(Q_i^{N_{max}}\right)$ | $Q_i^{N_{max}}$ |
| --- | --- |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |

TABLE 5-continued

| $W\left(Q_i^{N_{max}}\right)$ | $Q_i^{N_{max}}$ |
| --- | --- |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |

29

TABLE 5-continued

| $W(Q_i^{Nmax})$ | $Q_i^{Nmax}$ |
| --- | --- |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |

30

TABLE 5-continued

| $W(Q_i^{Nmax})$ | $Q_i^{Nmax}$ |
| --- | --- |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |

TABLE 5-continued

| $W(Q_i^{Nmax})$ | $Q_i^{Nmax}$ |
|---|---|
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |

TABLE 5-continued

| $W(Q_i^{Nmax})$ | $Q_i^{Nmax}$ |
|---|---|
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |

TABLE 5-continued         TABLE 5-continued

| $W(Q_i^{Nmax})$ | $Q_i^{Nmax}$ | $W(Q_i^{Nmax})$ | $Q_i^{Nmax}$ |
|---|---|---|---|
| 438 | 342 | 515 | 335 |
| 439 | 316 | 516 | 480 |
| 440 | 241 | 517 | 315 |
| 441 | 778 | 518 | 221 |
| 442 | 563 | 519 | 370 |
| 443 | 345 | 520 | 613 |
| 444 | 452 | 521 | 422 |
| 445 | 397 | 522 | 425 |
| 446 | 403 | 523 | 451 |
| 447 | 207 | 524 | 614 |
| 448 | 674 | 525 | 543 |
| 449 | 558 | 526 | 235 |
| 450 | 785 | 527 | 412 |
| 451 | 432 | 528 | 343 |
| 452 | 357 | 529 | 372 |
| 453 | 187 | 530 | 775 |
| 454 | 236 | 531 | 317 |
| 455 | 664 | 532 | 222 |
| 456 | 624 | 533 | 426 |
| 457 | 587 | 534 | 453 |
| 458 | 780 | 535 | 237 |
| 459 | 705 | 536 | 559 |
| 460 | 126 | 537 | 833 |
| 461 | 242 | 538 | 804 |
| 462 | 565 | 539 | 712 |
| 463 | 398 | 540 | 834 |
| 464 | 346 | 541 | 661 |
| 465 | 456 | 542 | 808 |
| 466 | 358 | 543 | 779 |
| 467 | 405 | 544 | 617 |
| 468 | 303 | 545 | 604 |
| 469 | 569 | 546 | 433 |
| 470 | 244 | 547 | 720 |
| 471 | 595 | 548 | 816 |
| 472 | 189 | 549 | 836 |
| 473 | 566 | 550 | 347 |
| 474 | 676 | 551 | 897 |
| 475 | 361 | 552 | 243 |
| 476 | 706 | 553 | 662 |
| 477 | 589 | 554 | 454 |
| 478 | 215 | 555 | 318 |
| 479 | 786 | 556 | 675 |
| 480 | 647 | 557 | 618 |
| 481 | 348 | 558 | 898 |
| 482 | 419 | 559 | 781 |
| 483 | 406 | 560 | 376 |
| 484 | 464 | 561 | 428 |
| 485 | 680 | 562 | 665 |
| 486 | 801 | 563 | 736 |
| 487 | 362 | 564 | 567 |
| 488 | 590 | 565 | 840 |
| 489 | 409 | 566 | 625 |
| 490 | 570 | 567 | 238 |
| 491 | 788 | 568 | 359 |
| 492 | 597 | 569 | 457 |
| 493 | 572 | 570 | 399 |
| 494 | 219 | 571 | 787 |
| 495 | 311 | 572 | 591 |
| 496 | 708 | 573 | 678 |
| 497 | 598 | 574 | 434 |
| 498 | 601 | 575 | 677 |
| 499 | 651 | 576 | 349 |
| 500 | 421 | 577 | 245 |
| 501 | 792 | 578 | 458 |
| 502 | 802 | 579 | 666 |
| 503 | 611 | 580 | 620 |
| 504 | 602 | 581 | 363 |
| 505 | 410 | 582 | 127 |
| 506 | 231 | 583 | 191 |
| 507 | 688 | 584 | 782 |
| 508 | 653 | 585 | 407 |
| 509 | 248 | 586 | 436 |
| 510 | 369 | 587 | 626 |
| 511 | 190 | 588 | 571 |
| 512 | 364 | 589 | 465 |
| 513 | 654 | 590 | 681 |
| 514 | 659 | 591 | 246 |

TABLE 5-continued

| $W(Q_i^{Nmax})$ | $Q_i^{Nmax}$ |
|---|---|
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |

TABLE 5-continued

| $W(Q_i^{Nmax})$ | $Q_i^{Nmax}$ |
|---|---|
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |

TABLE 5-continued

| $W(Q_i^{Nmax})$ | $Q_i^{Nmax}$ |
| --- | --- |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |

TABLE 5-continued

| $W(Q_i^{Nmax})$ | $Q_i^{Nmax}$ |
| --- | --- |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |

TABLE 5-continued

| $W(Q_i^{Nmax})$ | $Q_i^{Nmax}$ |
|---|---|
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |

TABLE 5-continued

| $W(Q_i^{Nmax})$ | $Q_i^{Nmax}$ |
|---|---|
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Rate Matching

In the NR standard, rate matching consists of interleaving and puncturing/shortening/repetition operations. If $d_0$, $d_1$, $d_2, \ldots, d_{N-1}$ is the interleaver input and $y_0, y_1, y_2, \ldots, y_{N-1}$ is the interleaver output, the input and output relationship of the interleaver is as follows.

$$\text{for } n = 0 \text{ to } N - 1$$
$$i = \lfloor 32n/N \rfloor;$$
$$J(n) = P(i) \times (N/32) + \text{mod}(n, N/32);$$
$$y_n = d_{J(n)};$$
$$\text{end for}$$

At this time, the interleaver pattern P(i) can be exemplified as shown in Table 6 below.

TABLE 6

| i | P(i) | i | P(i) | i | P(i) | i | P(i) | i | P(i) | i | P(i) | i | P(i) | i | P(i) |
|---|------|---|------|---|------|---|------|---|------|---|------|---|------|---|------|
| 0 | 0 | 4 | 3 | 8 | 8 | 12 | 10 | 16 | 12 | 20 | 14 | 24 | 24 | 28 | 27 |
| 1 | 1 | 5 | 5 | 9 | 16 | 13 | 18 | 17 | 20 | 21 | 22 | 25 | 25 | 29 | 29 |
| 2 | 2 | 6 | 6 | 10 | 9 | 14 | 11 | 18 | 13 | 22 | 15 | 26 | 25 | 30 | 30 |
| 3 | 4 | 7 | 7 | 11 | 17 | 15 | 19 | 19 | 21 | 23 | 23 | 27 | 28 | 31 | 31 |

The puncturing/shortening is a method of not transmitting part of the encoded bit when the resources allocated for transmission are less than the encoded bit. The repetition is a method of repeatedly transmitting part of the encoded bit when the resources allocated for transmission are greater than the encoded bit.

According to the NR standard, the puncturing and shortening are performed separately according to the coding rate. Specifically, when the size of the encoded bit is E and the data block size is K, If $K/E \leq 7/16$, the puncturing is performed, 2) If not (K/E is less than 7/16), the shortening is performed. Additionally, when the puncturing/shortening is performed, a specific bit channel of the encoder is configured as frozen (i.e. bit value 0) by a method exemplified in Table 7 below.

TABLE 7 if $E < N$ if $K/E \leq 7/16$    – puncturing for $n = 0$ to $N - E - 1$ $\overline{Q}_{F,imp}^{N} = \overline{Q}_{F,imp}^{N} \cup \{J(n)\};$ end for if $E \geq 3N/4$ $\overline{Q}_{F,imp}^{N} = \overline{Q}_{F,imp}^{N} \cup \{0, 1, \ldots, \lceil 3N/4 - E/2 \rceil - 1\};$ else $\overline{Q}_{F,imp}^{N} = \overline{Q}_{F,imp}^{N} \cup \{0, 1, \ldots, \lceil 9N/16 - E/4 \rceil - 1\};$ end if else    – shortening for $n = E$ to $N - 1$ $\overline{Q}_{F,imp}^{N} = \overline{Q}_{F,imp}^{N} \cup \{J(n)\};$ end for end if end if $\overline{Q}_{I,imp}^{N} = Q_0^{N-1} \backslash \overline{Q}_{F,imp}^{N};$ $\overline{Q}_I^{N}$ comprises $(K + n_{PC})$ most reliable bit indices in $\overline{Q}_{I,imp}^{N};$ $\overline{Q}_F^{N} = Q_0^{N-1} \backslash \overline{Q}_I^{N};$ In Table 7, N is the mother code size, and $n_{PC}$ represents the number of parity check bits (PC bits) when a parity check polar code (PC polar code) is supported.

$$\overline{Q}_I^{N}$$

represents a bit channel index used for data block allocation in a polar sequence, and $$\overline{Q}_F^{N}$$

represents a bit channel index configured as frozen.

Parity Check Polar Code (PC Polar Code)

The PC polar code is a polar code that arranges a parity check bit (PC bit) generated using part of the data block at the input of the polar encoder. The PC polar code is a polar code supported when the data block size is $18 <= K <= 25$.

In the NR standard, the PC bit is 3 bits, and is generated using a 5-bit shift register as shown in FIG. 12.

FIG. 12 is a diagram for explaining generation of a parity check bit according to an embodiment of the present disclosure.

Referring to FIG. 12, y[0], . . . , y[4], which is a 5-bit shift register in FIG. 12, is all initialized to 0. That is, the PC bit may be generated according to Table 8 below for the data block [u0, u1, u2, . . . , uN−1].

TABLE 8

| cyclic left shift the register | |
|---|---|
| if ui is an information bit: XOR y[0]) | set y [0] = (ui) |
| if ui is a PC bit: | set ui =y [0] |

The PC bit generated in this way is allocated to the input bit channel of the polar encoder as follows. Here, when E−K+3>192, it is $$n_{PC}^{wm} = 1,$$

and when E−K+3<=192, it is $$n_{PC}^{wm} = 0.$$

And, $$\hat{Q}_I^{N}$$

are the $$(|\overline{Q}_I^{N}| - n_{PC})$$

most reliable bit indices in $$\mathcal{Q}_I^N.$$

$$(n_{PC} - n_{PC}^{wm})$$

parity check bits are arranged in the $$(n_{PC} - n_{PC}^{wm})$$

least reliable bit indices in $$\mathcal{Q}_I^N.$$

The remaining $$n_{PC}^{wm}$$

parity check bits are arranged in the bit indices of minimum row weight in $$\hat{\mathcal{Q}}_I^N.$$

If there are more bit indices with the same minimum row weight in $$\hat{\mathcal{Q}}_I^N$$

than $$n_{PC}^{wm},$$

the remaining $$n_{PC}^{wm}$$

parity check bits are arranged in $$n_{PC}^{wm}$$

bit indices with a highest reliability and minimum row weight in $$\hat{\mathcal{Q}}_I^N.$$

HARQ (Hybrid Automatic Repeat and reQuest)

HARQ is a technology that combines forward error correction (FEC) and automatic repeat request (ARQ). That is, the transmitter transmits all or part of the coded bits encoded using FEC, and the receiver detects errors in the received data and then transmits a HARQ-ACK signal to the transmitter. If there are no errors in the data received by the receiver, the transmitter transmits new data, while if there are errors in the received data, the transmitter retransmits the corresponding data block.

The receiver detects errors by combining the retransmitted data block with the previously transmitted data block and then decoding it again. This operation can be performed until no errors are detected or until a predetermined order is reached. Combining methods for decoding retransmitted data blocks can be divided into two types.

Chase combining: This is a method in which the same coded bit as the first transmitted coded bit is retransmitted. The error probability can be reduced through power gain when decoding a retransmitted data block.

Incremental redundancy: This is a method in which coded bits that are not the same as the first transmitted coded bit are retransmitted. When decoding a retransmitted data block, the error probability can be reduced through coding gain. In general, chase combining can be interpreted as a special embodiment of incremental redundancy.

In the present disclosure, a coded bit may mean a codeword.

HARQ methods can be divided as follows. HARQ methods can be divided into 1) synchronous HARQ and asynchronous HARQ depending on the timing of retransmission, and can be divided into 2) channel-adaptive methods and channel-non-adaptive methods depending on whether channel states are reflected in the amount of resources used in retransmission.

The synchronous HARQ method is a method in which, if the initial transmission fails, subsequent retransmission is performed at a timing determined by the system. That is, assuming that the timing of retransmission is made every fourth time unit after the initial transmission failure, this has already been agreed upon between the base station and the UE. Therefore, there is no need to perform additional signaling to inform this timing. However, if the data transmitting side receives a NACK message, the frame is retransmitted every fourth time unit until the ACK message is received.

On the other hand, in the Asynchronous HARQ method, retransmission timing may be newly scheduled or determined through additional signaling. On the other hand, the asynchronous HARQ method can be determined through new scheduling or additional signaling of retransmission timing. The timing at which retransmission of a previously failed frame occurs may vary depending on various factors such as channel states.

The channel-non-adaptive HARQ method is a method in which frame modulation, the number of resource blocks used, AMC, etc. are used as determined at the time of initial transmission in retransmission. In contrast, the channel-adaptive HARQ method is a method in which frame modulation, the number of resource blocks used, AMC, etc. are varied depending on the channel states.

For example, the transmitting side transmits data using 6 resource blocks during initial transmission, and then retransmits using the same 6 resource blocks in retransmission, which is a channel-non-adaptive HARQ method. On the other hand, even if transmission is first performed using 6 resource blocks, later retransmission is performed using resource blocks larger or smaller than 6 depending on the channel state, which is a channel-adaptive HARQ method.

Each of the four HARQ combinations can be achieved by this classification, but the mainly used HARQ method includes an asynchronous and channel-adaptive HARQ method and a synchronous and channel-non-adaptive HARQ method.

The asynchronous channel-adaptive HARQ method can maximize retransmission efficiency by adaptively varying the retransmission timing and amount of resources used depending on the channel states, but has the disadvantage of increasing overhead, so it is not generally considered for uplink.

On the other hand, the synchronous and channel-non-adaptive HARQ method has the advantage of almost no overhead for retransmission because the timing and resource allocation for retransmission are promised within the system, but has the disadvantage that retransmission efficiency is very low when used in highly variable channel states.

Hereinafter, a method of supporting HARQ of polar code is examined.

Incremental Freezing (IF)

When performing polar encoding, data blocks are arranged in the bit channels of the encoder in order of the reliability, and then encoding is performed. Incremental freezing is a HARQ method that achieves performance gains by arranging data arranged in a bit channel with a relatively low reliability into a channel with a high reliability and then encoding it when retransmitting.

FIG. 13 illustrates a polar encoding operation performed to support IF-HARQ according to an embodiment of the present disclosure.

Referring to FIG. 13, it is assumed that N, the mother code size, is 16, and the size K of the data block is 12. 13a represents bit channel indices, and 13b represents bit channel indices rearranged according to a reliability order. At this time, the reliability order may be an ascending order (low reliability->high reliability), but is not limited to this and a different order (descending order) may be applied.

When a data block is first transmitted, 13c represents data blocks (u0 to u11) allocated to bit channel indices 13a. When retransmission related to the data block is performed, 13d represents data blocks (u0 to u2, u4 to u6) allocated to the bit channel indices 13a.

In a polar encoder with N=16, the polar sequence 13b listed in an ascending order of the reliability is assumed to be {0, 1, 2, 4, 8, 3, 5, 6, 9, 10, 12, 7, 11, 13, 14, 15}.

In the first transmission (1st Tx), a data block is arranged on the bit channel {8, 3, 5, 6, 9, 10, 12, 7, 11, 13, 14, 15} and encoding is performed (13c).

If an error occurs during decoding of the first transmission and retransmission (2nd Tx) is performed, data arranged on a bit channel with a low reliability among the first transmitted data is arranged on a bit channel with a high reliability and then encoding is performed.

Specifically, assuming that the position of 6 bits of the 12 bits first transmitted is changed, the data bits (u4, u0, u1, u2, u5, u6) arranged in bit channel {8, 3, 5, 6, 9, 10} are arranged in bit channel {12, 7, 11, 13, 14, 15}, and then encoding is performed. At this time, decoding can be performed by the receiver in FIG. 14.

FIG. 14 illustrates a receiver structure supporting IF-HARQ according to an embodiment of the present disclosure.

Referring to FIG. 14, a hard decision value of the data bit arranged in the bit channel {12, 7, 11, 13, 14, 15} in the first transmission is used in decoding for retransmission. Here, the hard decision means that the received data is decoded only into binary (0 or 1).

It is desirable to implement IF-HARQ combining by combining the log-likelihood ratio (LLR) of the decoded bits. It is possible to allocate retransmitted data bits to a bit channel by considering the reliability of the bit channel transmitted in the first transmission. It is possible to allocate bit channels in retransmission in the reverse order of the reliability of the first transmission. Hereinafter, it will be described in more detail based on FIG. 13.

The data bits (u4, u0, u1, u2, u5, u6) arranged in the bit channel {8, 3, 5, 6, 9, 10} are arranged in the bit channel {15, 14, 13, 11, 7, 12}, and then encoding may be performed. Through this, greater performance gains can be expected as the reliability of each bit is improved on average.

Information on the number of data bits arranged to bit channel indexes with high reliability in retransmission may be defined in the standard or transmitted to the UE via L1/MAC/RRC signaling.

According to an embodiment, when the number of data bits transmitted in an initial transmission is K, the number of data bits arranged to bit channel indexes with high reliability in retransmission by an IF-HARQ scheme may be set to K−K1 or K1*K.

As an example, K1 may be set to the same value regardless of the number of retransmissions. For example, K1 in a first retransmission may be the same as K1 in a second retransmission. As another example, K1 may be set to a different value for each retransmission. For example, K1 in a first retransmission and K1 in a second retransmission may be set to different values.

According to an embodiment, if the number of data bits allocated to a bit channel of a polar encoder in an m-th transmission is K(m), the number of data bits in an (m+1)-th transmission may be configured to meet K(m+1)=K(m)−K1 or K(m+1)=K1*K(m). In this instance, as described above, K1 may be set to 1) the same value regardless of the number of retransmissions or 2) a different value for each retransmission.

Incremental Redundancy (IR)

In order to support IR-HARQ of polar code, the mother code size can be increased in retransmission. For example, if the mother code size used in the first transmission is N, a mother code size increased to 2N may be used in retransmission. Hereinafter, it will be described in detail with reference to FIG. 15. At this time, considering complexity, the increased mother code size may be limited to 2N or 4N even when retransmission is repeatedly performed. In other words, when retransmission is repeatedly performed, the maximum value of the mother code size used may be limited to two or four times the mother code size used in the first transmission. This is because complexity may increase excessively if the mother code size repeatedly increases with each retransmission.

Hereinafter, it will be described in detail with reference to FIG. 15.

FIG. 15 is a diagram for explaining an encoding operation related to incremental redundancy according to an embodiment of the present disclosure.

(a) of FIG. 15 illustrates bit channel allocation for a polar sequence and data block size K=6 when the mother code size is N=8 and 16.

(b) of FIG. 15 illustrates an encoding operation when the mother code size is N=8 and 16.

In FIG. 15, it is assumed that the mother code size is N=8 when the first transmission (1st Tx) of a polar code with a data block size of K=6, and the mother code size is N=16 when retransmission (2nd Tx).

In the case of the first transmission, since K=6, a data block is arranged at the bit channel index {2, 4, 3, 5, 6, 7} determined from the bit channel indices 15*b* rearranged according to the reliability order among the bit channel indices 15*a*. Based on this, polar encoding is performed.

When an error occurs after decoding of the first transmission and retransmission is performed, if a polar sequence for mother code size N=16 is applied, the bit channel index where the data block should be arranged is as follows.

Among the bit channel indices 15*c*, the bit channel indices determined from the bit channel indices 15*d* rearranged in order of the reliability are {12, 7, 11, 13, 14, 15}. Therefore, encoding must be performed by arranging a data block in the corresponding bit channel index {12, 7, 11, 13, 14, 15}.

However, in order to support IR HARQ, the characteristic that the coded bit generated for first transmission must be included in the coded bit generated for retransmission must be satisfied.

Hereinafter, it will be described in detail in relation to the corresponding characteristic. When the mother code size increases from N to 2N, a polar encoded codeword can be expressed as $$[U_2 \ U_1]\begin{bmatrix} F & 0 \\ F & F \end{bmatrix} = [(U_1 + U_2)FU_1F].$$

Here, F is a kernel for polar encoding of mother code size N, and $[U_2 \ U_1]$ is a data block. In this case, $U_1F$ must be the codeword of the first transmission to support IR HARQ. Therefore, data arranged in bit channel index 7 (data to which bit channel index 7 is allocated) must also be allocated to bit channel index 10.

In other words, when data is arranged in the bit channel index {12, 7, 11, 13, 14, 15} determined according to the reliability order, the data is not arranged in bit channel index 10, so the coded bits at the time of first transmission are not included in the coded bits at the time of retransmission. In this case, the characteristics to support IR-HARQ are not met.

A copy operation may be considered to solve the above problem. The copy operation is an operation to copy data bits to specific bit channel index(s) so that the characteristics for supporting IR HARQ are met. Specifically, through the copy operation, the same data bits are arranged in bit channel index 7 and bit channel index 10, and then encoding can be performed. Such a copy operation can be performed in cases 1) and 2) below.

1) When retransmitting, the mother code size increases (e.g. 8->16)
2) A data block is arranged at the bit channel index corresponding to the upper polar encoder. That is, the data block is arranged at the bit channel index (e.g. 7) corresponding to the lower polar subcode (e.g. 0 to 7).

The copy operation can be performed as follows.

The data bit arranged in the lower polar subcode of the polar code (e.g. second polar code) for retransmission is additionally arranged in the bit channel index(s) of the second polar code corresponding to the bit channel index(s) (e.g. one or more first bit channels) of the polar code (e.g. first polar code) where the data bit was arranged during the initial transmission.

According to one embodiment, the copy operation may be performed based on the size of the data block being more than a certain value. The specific value may mean the data block size when a data block (or data bit) is first arranged in the bit channel index belonging to the lower polar subcode among the bit channel indices of the polar code for retransmission.

The specific value described above may be defined based on the ranking of the bit channel index belonging to the lower polar subcode. Specifically, when the bit channel indices of the polar code are rearranged in a reliability order (descending order), the specific value may be related to the ranking of the bit channel index with the highest reliability among the bit channel indices belonging to the lower polar subcode.

The specific value will be described in detail below based on FIG. 15.

According to the example of FIG. 15, when the mother code size (N) is 16, bit channel indices related to the upper polar encoder (or belonging to the lower polar subcode) are 0 to 7. Among bit channel indices 0 to 7, the bit channel index with the highest reliability is 7.

The entire bit channel indices rearranged according to the reliability order (descending order) are as follows as bit channel indices in reverse order of 15d.

{15,14,13,11,7,12,10,9,6,5,3,8,4,2,1,0}

The most reliable bit channel index (7) among the bit channel indices of the lower polar subcode has a 5th ranking among the total bit channel indices {15, 14, 13, 11, 7, 12, 10, 9, 6, 5, 3, 8, 4, 2, 1, 0} rearranged according to the reliability order (descending order).

Therefore, in this case, the specific value is 5, and when the data block size is 5 or more, the retransmitted coded bit does not include the coded bit (15*b*) at the time of first transmission, so the copy operation needs to be performed.

Based on the copy operation, a coded bit for retransmission is generated (15*e*). The coded bit (15*e*) for retransmission includes the coded bit (15*b*) at the time of first transmission.

In (b) of FIG. 15, 15*f*-0 to 15*f*-15 indicate a reliability. Specifically, 15*f*-0 indicates the reliability of bit channel index 0 among bit channel indices (0 to 15). 15*f*-15 indicates the reliability of bit channel index 15 among bit channel indices (0 to 15). The reliability can be expressed as a probability value related to the occurrence of an error. Bit channel index 15 has the highest reliability because its value (0.0001) is the smallest, and bit channel index 0 has the lowest reliability because its value (1.0) is the greatest.

Among the bit channel indices (0 to 15), 15*f*-0 to 15*f*-7 are related to the upper polar encoder, and 15*f*-8 to 15*f*-15 are related to the lower polar encoder.

According to the LTE/NR standard, control information of a channel (PDSCH) for transmitting downlink data or a channel (PUSCH) for transmitting uplink data is transmitted on a downlink control channel (PDCCH). A UE detects control information on the downlink data transmitted on the PDCCH and then receives data by decoding the PDSCH. Alternatively, the UE may detect scheduling information of the PUSCH for transmission of the uplink data transmitted on the PDCCH and then transmit the uplink data through the PUSCH.

In the NR standard, a polar code is used for the PDCCH or the PUCCH/PUSCH for transmitting control information (control data) (e.g., DCI, UCI).

A size of the control data is predefined in the standard, and time/frequency resources allocated to the PDCCH or the PUCCH/PUSCH are also defined. Since the size of the control data and resources allocated for transmission of the data are predefined, a size of a coded bit generated for transmission of the control data is also determined. The coded bit is generated based on encoding of the control data.

Based on the information, a mother code size of a polar encoder may be determined. For example, it may be assumed that a size K of control data corresponding to DCI is 40, and a size E of a coded bit transmitted in the time/frequency resources allocated to the PDCCH is 120. Since a code rate (i.e., K/E=1/3) is less than 7/16, puncturing is used. 8 bits are punctured in a codeword generated using mother code size N=128, and then the codeword is transmitted on the PDCCH.

If the polar code is also used in unicast data, higher order modulation, such as quadrature amplitude modulation (QAM) (e.g., 16QAM, 64QAM, 256QAM), as well as quadrature phase shift keying (QPSK) may be used.

In this instance, a size of a data block encoded using the polar code may be indicated based on a data block size of NR PDSCH or PUSCH. Specifically, the size of the data block encoded using the polar code may be indicated as a transport block size (TBS). That is, the TBS may be calculated from an MCS indication and DCI related to allocation of the time/frequency resources. Accordingly, the mother code size of the polar encoder may be calculated from a payload size E that can be transmitted based on K (e.g., TBS) and the time/frequency resources.

However, if polar code-based IR-HARQ is applied to transmission of the PDSCH, the following problem may occur.

If an error occurs in transmission of the PDCCH, the UE cannot receive the PDSCH as well as the PDCCH. As described above, this is because control information for decoding of the PDSCH is transmitted on the PDCCH. Accordingly, even if an error occurs in transmission of the PDCCH (even if the UE fails to receive the PDCCH due to an error generated in transmission of the PDCCH), it is required to design a signaling method capable of stably supporting the polar code-based IR-HARQ.

Below, a method of solving the above-described problem is described in detail.

It is assumed that transmission of a transport block (TB) generated through polar encoding is scheduled based on the transmission of the PDCCH. In this instance, it is assumed that an error occurs in a PDCCH of an initial transmission of the TB (PDCCH that schedules the initial transmission).

Because the error occurred in the PDCCH (transmission), the UE cannot also receive the PDSCH (the TB of the initial transmission) decoded using control information obtained through reception of the PDCCH. Hence, the UE cannot transmit any signal to the base station at a time of transmitting HARQ-ACK. On the other hand, the base station attempts to detect PUCCH or PUSCH including HARQ-ACK information of the UE.

Detection of the HARQ-ACK information may vary depending on a base station implementation method, but HARQ-ACK based on discontinuous transmission (DTX) may be detected as NACK. The above operation may be related to the requirements for an error of HARQ-ACK. The error of HARQ-ACK may be divided into two types. The error of HARQ-ACK includes 1) ACK-to-NACK error and 2) NACK-to-ACK error.

The ACK-to-NACK error is an error in which a signal transmitted as ACK is detected as NACK. The NACK-to-ACK is an error in which a signal transmitted as NACK is detected as ACK. In this instance, from an L2 layer perspective, it is more important to reduce the probability of occurrence of the NACK-to-ACK error. This is described in detail below.

If the ACK-to-NACK error occurs, the following operation may be assumed. The UE has already successfully decoded the TB and transmits ACK to the base station based on this. The base station determines that the UE fails to receive the TB due to the ACK-to-NACK error (i.e., the UE fails to decode the TB). Hence, the base station retransmits the TB to the UE. As above, in the ACK-to-NACK error, even though the UE has normally received the TB, retransmission is performed due to the error, which may degrade the system yield.

If the NACK-to-ACK error occurs, the following operation may be assumed. The UE has failed to successfully decode the TB and transmits NACK to the base station based on this. The base station determines that the UE has normally received the TB due to the NACK-to-ACK error (i.e., the UE has succeeded in decoding the TB). Hence, the base station transmits a new TB to the UE. Unlike the ACK-to-NACK error, a TB loss occurs in the NACK-to-ACK error. Since upper layer retransmission is required to recover the TB, the system yield is further degraded compared to the ACK-to-NACK error. In this regard, the requirements for the NACK-to-ACK error are generally set more strictly than the requirements for the ACK-to-NACK error.

Since HARQ-ACK based on the DTX is detected as NACK at the base station, the base station performs retransmission for the TB. In general, a transmission block size (TBS) is maintained uniformly in the retransmission, but the time/frequency resource allocated for the retransmission may be changed. Further, the base station may adjust the time/frequency resource in the retransmission considering the coded bit at the time of the initial transmission. For example, if IR-HARQ is supported, the UE performs decoding by combining the coded bits of the initial transmission and the coded bits of the retransmission. The base station may configure the time/frequency resources so that a coded bit size in the retransmission is less than a coded bit size in the initial transmission. Nevertheless, the UE can obtain a greater coding gain through the combining, and error performance can be improved.

If the time/frequency resources change in the retransmission, a difference occurs between the coded bit size in the initial transmission and the coded bit size in the retransmission. For the support of IR-HARQ, a mother code size for retransmission may be set to a sum of the coded bit size in the initial transmission and the coded bit size in the retransmission. In this case, a mother code size used by the base station to generate a codeword may be different from a mother code size used by the UE (i.e., a mother code size assumed to be used by the base station at the UE). When the mother code size used by the base station is different from the mother code size used (assumed) by the UE, an error may occur in the decoding of the UE/BS, causing repeatedly the retransmission.

For example, as the UE fails to decode the TB transmission of the base station, there may be a case where the base station shall repeatedly transmit the TB (PDSCH repetition transmission). As another example, as the base station fails to decode the TB transmission of the UE, there may be a case where the UE shall repeatedly transmit the TB (PUSCH repetition transmission).

Accordingly, as above, to avoid a situation in which there is a difference in the mother code size between the base station and the UE, a method of indicating a mother code size via DCI may be considered. If data and PC bits are arranged to the bit channel indexes based on a copy operation in the retransmission, a polar code-based IR-HARQ signaling method needs to be designed to be robust to the PDCCH error.

As described above, the copy operation may be performed in the following cases 1) and 2).

1) Increase in the mother code size compared to the initial transmission

2) Arrangement of data bits to bit channel indexes belonging to a lower polar subcode Accordingly, in relation to the design of the IR-HARQ signaling method robust to the PDCCH error, it may be assumed a case in which the mother code size increases in the retransmission. This is described in detail below with reference to FIGS. 16 to 18.

Figure 16:
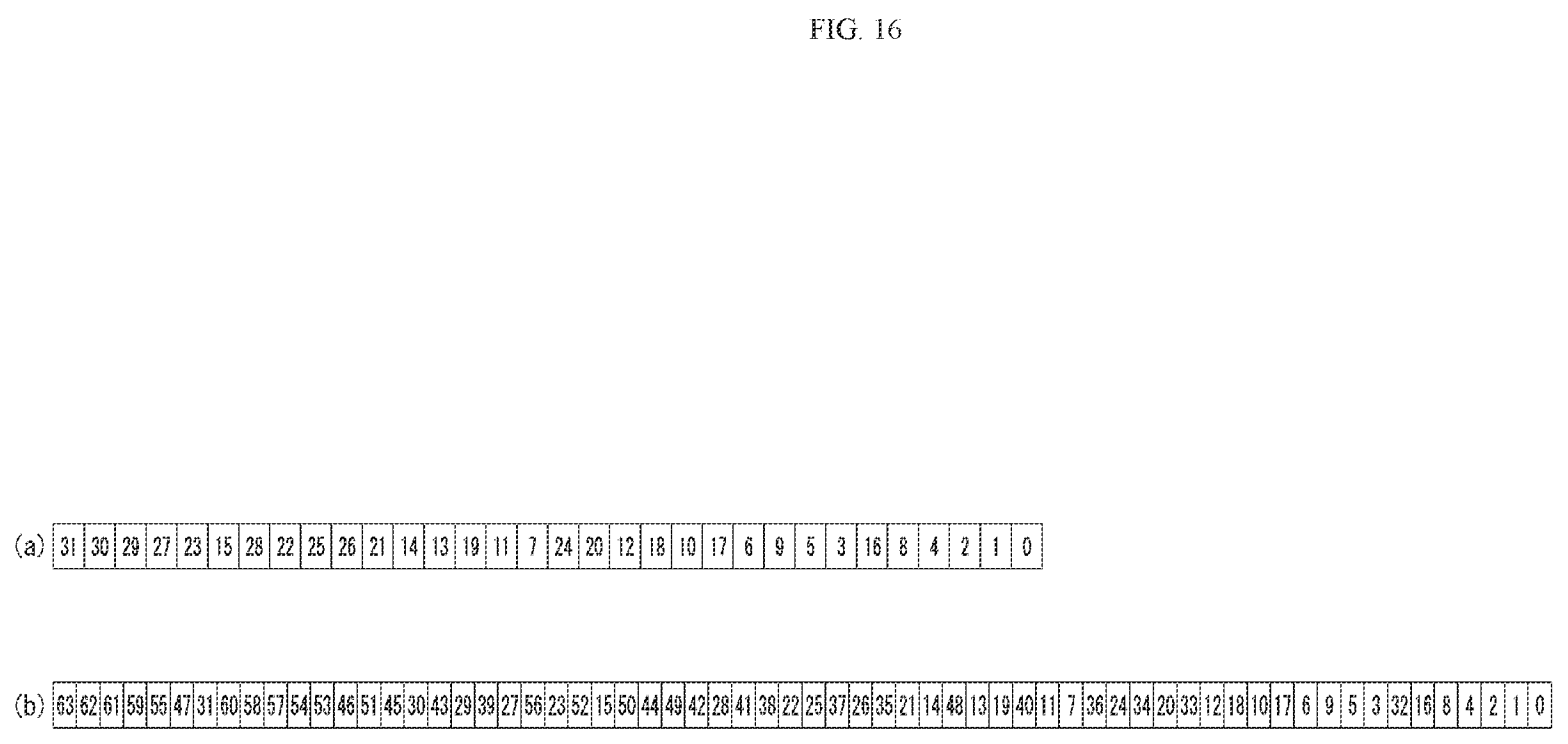

FIG. 16 illustrates bit channel indices rearranged in order of a reliability of a bit channel according to an embodiment of the present disclosure. The bit channel indices may be bit channel indices determined according to Table 5 above. Specifically, (a) of FIG. 16 shows bit channel indices when N=32, and (b) of FIG. 16 shows bit channel indices when N=64.

In (b) of FIG. 16, when the data block size is less than 7 according to the polar sequence of N=64, data is arranged in the lower polar encoder. That is, a bit channel index is allocated to data in the range of 32 to 63. In this case, $U_2=0$ in the N=64 codeword expressed in the form of $[(U_1+U_2)F\ U_1F]$, and the final codeword becomes $[U_1F\ U_1F]$. Therefore, in retransmission, coded bit $U_1F$ becomes a repetition of the first transmission $U_1F$.

Figure 17:
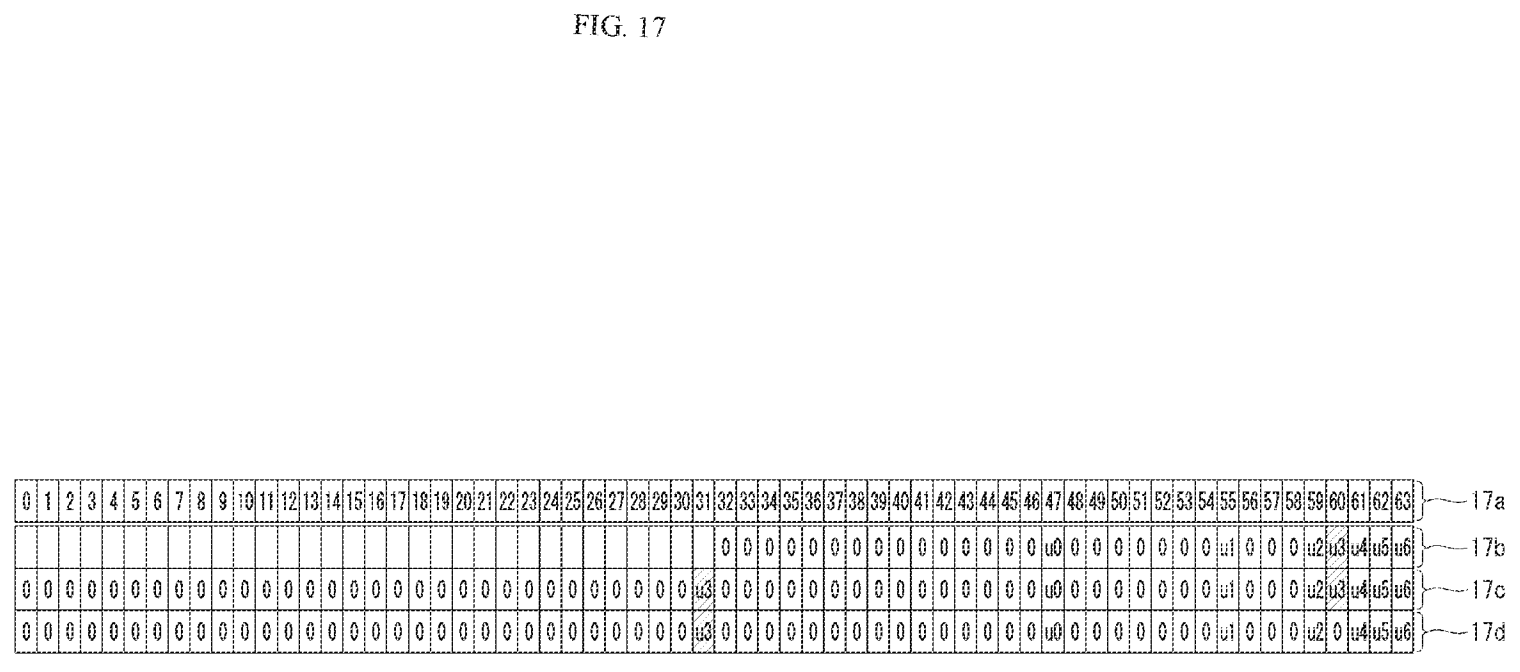

FIG. 17 illustrates an example of data arranged to bit channel indexes based on a specific payload size in accordance with an embodiment of the present disclosure.

Referring to FIG. 17, a data block size K is 7, and a payload size E is 24 (17b) and 34 (17c and 17d). It is assumed that a retransmission is performed after an initial transmission of a base station (BS), and an error occurs in a PDCCH related to the initial transmission. In this instance. 17b is related to the initial transmission (e.g., initial transmission of PDSCH), 17c is related to a retransmission (e.g., retransmission of PDSCH) of the BS for the initial transmission, and 17d is related to a transmission (17c) of the BS assumed by a UE due to an error of the PDCCH of the initial transmission (i.e., an error of the PDCCH scheduling the PDSCH of the initial transmission).

17a represents bit channel indexes, and 17b represents an arrangement of data bits (allocation of the bit channel indexes to the data bits) for N=32 polar encoder. In 17b, the bit channel indexes are illustrated at a location shifted to the right by 32 for comparison with the arrangement of N=64 polar encoder, so as to easily check whether characteristics for IR HARQ support are satisfied.

17c represents an arrangement of data bit indexes for N=64 polar encoder. Further, 17c represents data arranged to the bit channel indexes in order for the BS to generate a codeword to be transmitted to the UE. That is, 17c represents the actual arrangement of data for the bit channel indexes related to the generation of the codeword for the retransmission.

17d represents an arrangement of data for the bit channel indexes assumed by the UE. Because the UE has failed to receive the PDSCH due to the PDCCH error in the initial transmission, the UE assumes the arrangement of data bits of 17d not the arrangement of 17c. That is, since the UE does not assume to perform a copy operation, the UE assumes the arrangement of data bits of 17d.

However, since the BS has already performed the initial transmission, in the retransmission, as illustrated in 17c, the BS arranges data to the bit channel indexes using the increased mother code size (N=64) compared to the initial transmission. That is, the BS also arranges data(u3) to bit channel index 60 based on the above-described copy operation to perform polar encoding. Therefore, the arrangement of data bits by the BS is not the same as the arrangement of data bits assumed by the UE.

To avoid the error, the following indication may be considered. Specifically, it may be indicated whether an operation of arranging data bits to bit channel indexes is performed based on the copy operation through the PDCCH.

If the data bits are arranged to the bit channel indexes based on the copy operation, the following operation (operation related to data arrangement in 17c) may be performed.

The copy operation is performed so that a data bit arranged to a bit channel index of a lower polar subcode is also arranged to a bit channel index of an upper polar subcode. In this instance, the copy operation is performed on a bit channel index with the highest reliability among bit channel indexes corresponding to the upper polar subcode configured with frozen bits in the range excluding a set of bit channel indexes determined based on the data block size and the order of reliability.

Referring to FIG. 17, the set of bit channel indexes determined based on the data block size (K=7) and order of reliability (descending order, bit channel index with high reliability->bit channel index low reliability) is {63, 62, 61, 59, 55, 47, 31} (see (b) of FIG. 16). In bit channel indexes 0 to 63, the bit channel index with the highest reliability among the bit channel indexes of the upper polar subcode excluding {63, 62, 61, 59, 55, 47, 31} is 60. Therefore, the copy operation is performed on the bit channel index 60. Data(u3) arranged to a bit channel index 31 of the lower polar subcode is also arranged to the bit channel index 60 (the bit channel index 60 is additionally allocated to the data(u3) to which bit channel index 31 is allocated).

Figure 18:
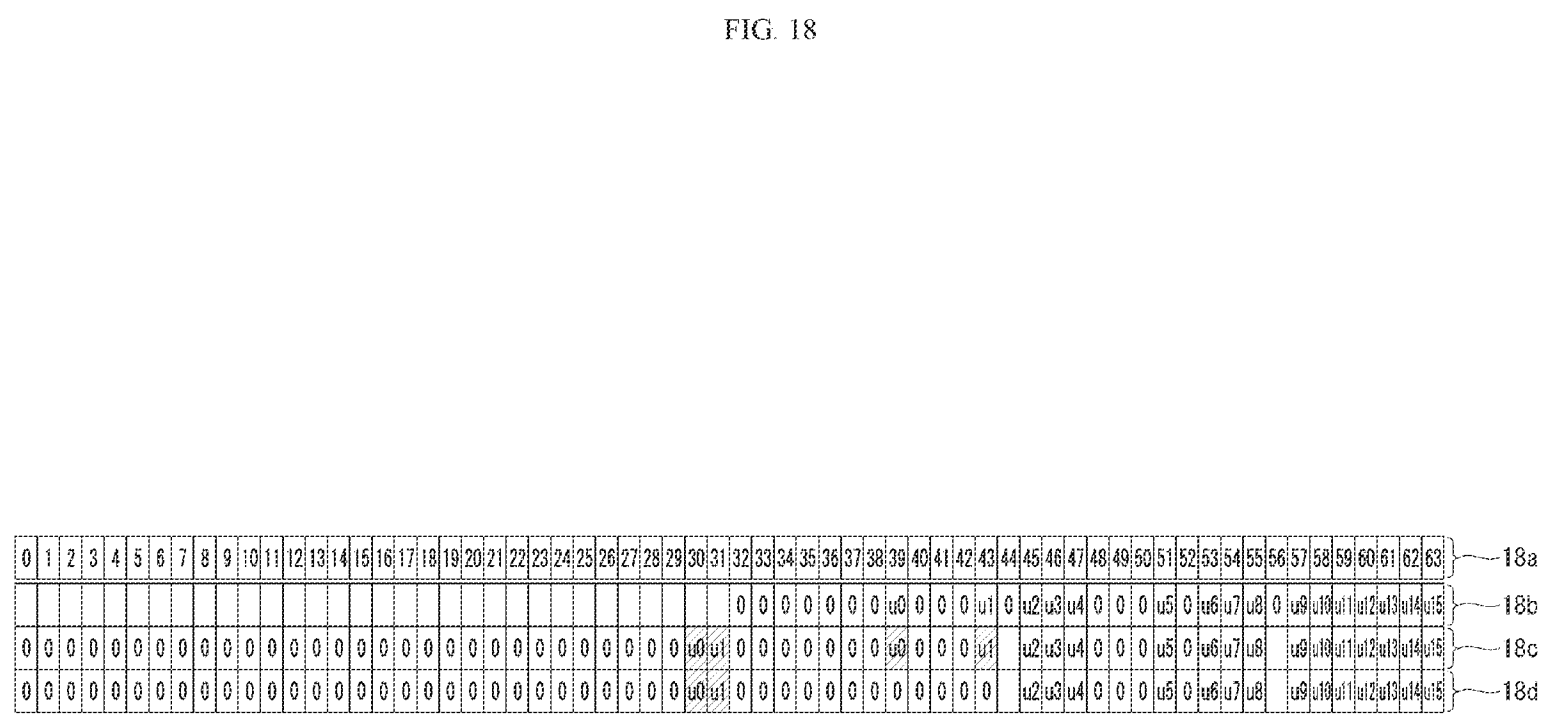

FIG. 18 illustrates another example of data arranged to bit channel indexes based on a specific payload size in accordance with an embodiment of the present disclosure.

Referring to FIG. 18, a data block size K is 16, and a payload size E is 30 (18b, 18c, 18d). Since 18a, 18b, 18c and 18d of FIG. 18 correspond to 17a, 17b, 17c and 17d of FIG. 17, redundant description is omitted.

Because a UE has failed to receive a PDSCH due to a PDCCH error in an initial transmission, the UE assumes an arrangement of data bits of 18d not an arrangement of 18c. That is, since the UE does not assume to perform a copy operation, the UE assumes the arrangement of data bits of 18d.

If the data bits are arranged to bit channel indexes based on the copy operation, the following operation (operation related to data arrangement in 18c) may be performed.

Referring to FIG. 18, a set of bit channel indexes determined based on the data block size (K=16) and order of reliability (descending order) is {63, 62, 61, 59, 55, 47, 31, 60, 58, 57, 54, 53, 46, 51, 45, 30} (see (b) of FIG. 16). In bit channel indexes 0 to 63, a bit channel index with the highest reliability among bit channel indexes of an upper polar subcode excluding {63, 62, 61, 59, 55, 47, 31, 60, 58, 57, 54, 53, 46, 51, 45, 30} is 43 and 39. Therefore, the copy operation is performed on the bit channel indexes 43 and 39. Data(u0, u1) arranged to bit channel indexes 30 and 31 of a lower polar subcode is also arranged to the bit channel indexes 39 and 43 (the bit channel indexes 39 and 43 are additionally allocated to the data(u0, u1) to which bit channel indexes 30 and 31 are allocated).

An implementation for an indication of a redundancy version (RV) related to the support of polar code-based IR-HARQ is described below.

According to the NR standard, coded bits generated through polar encoding are input to a circular buffer and then are selectively transmitted from the circular buffer based on a rate matching type as follows.

If the rate matching type is punctured, bits of locations (N-E) to (N-1) within the circular buffer are selected.

If the rate matching type is shortened, bits of locations 0 to (E-1) within the circular buffer are selected.

If the rate matching type is repetition, all bits within the circular buffer are selected, and additionally repeat (E-N) consecutive bits with the smallest index bit from the circular buffer.

The following method may be considered to support IR-HARQ for a TB encoded with a polar code. According to the method, coded bits for retransmission may be selected from a specific point of the circular buffer and transmitted sequentially. The above operation may be based on an operation of designating a redundancy version (RV) on a circular buffer in the LTE/NR standard.

Since a mother code size of the polar code is $2^n$, a mother code size in the initial transmission may be N, and a mother code size in the retransmission may be 2N. Looking at this from a perspective of the mother code size N in the initial transmission, the following mother code sizes may be assumed.

$$\{ \ldots ,4N,2N,N,N/2,N/4, \ldots \}$$

Considering that decoding in a receiver is performed based on the mother code size, locations within the circular buffer divided by equally dividing the circular buffer may be configured as a starting point of RV transmission.

For example, if the RV is 2 bits and the mother code size is N, locations {0, N/4, N/2, 3N/4} on the circular buffer may be configured as {RV0, RV1, RV2, RV3}. When the mother code size used in the retransmission increases from N to 2N, locations {0, N/2, N, 3N/2} on the circular buffer may be configured as {RV0, RV1, RV2, RV3}. In this instance, since RV0 and RV2 indicate starting points of the lower polar subcode and the upper polar subcode, there is an advantage in that decoding can be performed with the small mother code size. This is described in detail below with reference to FIGS. 19 and 20.

Figure 19:
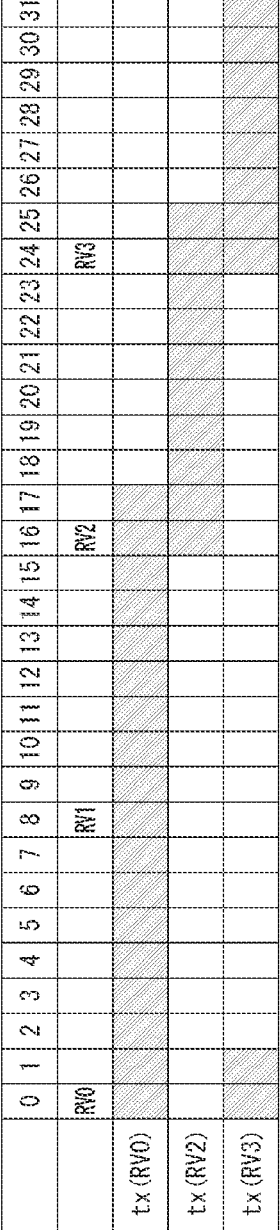
FIG. 19 illustrates a redundancy version (RV) when the same mother code size as an initial transmission is used in accordance with an embodiment of the present disclosure.

FIG. 19 illustrates an RV when the same mother code size as an initial transmission is used in accordance with an embodiment of the present disclosure. Specifically. FIG. 19 illustrates an example of an RV indication for supporting IR-HARQ in which a mother code size does not increase.

Referring to FIG. 19, it is assumed that a data block size K is 3 and a mother code size N is 32. 19a represents locations within a circular buffer to which coded bits encoded through a polar encoder of N=32 are input. 19b represents bits (i.e., coded bits) selected by the circular buffer by RV0 in an initial transmission (1st tx). 19c represents bits selected by the circular buffer by RV2 in a retransmission (2nd Lx) for the initial transmission. 19d represents bits selected by the circular buffer by RV3 in a retransmission for the retransmission (2nd tx).

It is assumed that a payload size E in 19b (1st tx) is 18, a payload size E in 19c (2nd tx) is 10, and a payload size E in 19d (3rd tx) is 10.

19r represents locations (or RV) on the circular buffer configurable by dividing the circular buffer based on N=32 into equal sizes (e.g., 8). Referring to 19r, {0, 8, 16, 24} that are the locations on the circular buffer may be configured as {RV0, RV1, RV2, RV3}.

A transmission start point is assumed as follows. The transmission start point is RV0 in the 1st tx, RV2 in the 2nd tx, and RV3 in the 3rd tx.

Referring to 19b of FIG. 19, in the 1st tx, since a code rate is 1/6 (i.e., K/E=3/18), puncturing is performed. 18 coded bits corresponding to the payload size E are selected from the location of the circular buffer corresponding to RV0, and the selected coded bits are transmitted.

Referring to 19c of FIG. 19, in the 2nd tx, since a code rate is 3/10 (i.e., K/E=3/10), puncturing is performed. 10 coded bits corresponding to the payload size E are selected from the location of the circular buffer corresponding to RV2, and the selected coded bits are transmitted.

Referring to 19d of FIG. 19, in the 3rd tx, since a code rate is 3/10 (i.e., K/E=3/10) in the same manner as the 2nd tx, puncturing is performed. 10 coded bits corresponding to the payload size E are selected from the location of the circular buffer corresponding to RV3, and the selected coded bits are transmitted. In this instance, 8 coded bits are selected from the location of RV3 to a last location (index 31) within the circular buffer, and the remaining two coded bits are selected from a first location (index 0) of the circular buffer.

Figure 20:
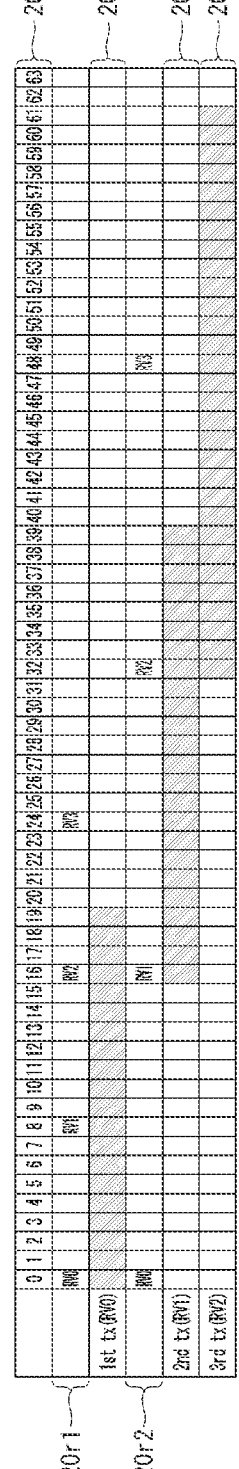
FIG. 20 illustrates an RV when a mother code size increased compared to an initial transmission is used in accordance with an embodiment of the present disclosure.

FIG. 20 illustrates an RV when a mother code size increased compared to an initial transmission is used in accordance with an embodiment of the present disclosure. Specifically, FIG. 20 illustrates an example of an RV indication for supporting IR-HARQ in which a mother code size increases.

Referring to FIG. 20, it is assumed that a data block size K is 7, a mother code size N in an initial transmission (1st tx) is 32, and a mother code size N in a retransmission (2nd tx and 3rd tx) is 64.

Since 20a, 20b, 20c and 20d of FIG. 20 correspond to 19a, 19b, 19c and 19d of FIG. 19, redundant description is omitted.

20r1 represents locations (or RV) on a circular buffer configurable by dividing the circular buffer based on N=32 into equal sizes (e.g., 8). Referring to 20r1, {0, 8, 16, 24} that are the locations on the circular buffer may be configured as (RV0, RV1, RV2, RV3).

20r2 represents locations (or RV) on a circular buffer configurable by dividing the circular buffer based on N=64 into equal sizes (e.g., 16). Referring to 20r2, {0, 16, 32, 48} that are the locations on the circular buffer may be configured as {RV0, RV1, RV2, RV3}.

It is assumed that a payload size E in 20b (1st tx) is 20, a payload size E in 20c (2nd tx) is 24, and a payload size E in 20d (3rd tx) is 30.

A transmission start point is assumed as follows. The transmission start point is RV0 (20r1) in the 1st tx, RV1 (20r2) in the 2nd tx, and RV2 (20r2) in the 3rd tx.

Referring to FIG. 20, in the 2nd tx, since a mother code size increases (32->64), a size of the circular buffer increases, and (the location within the circular buffer according to) the RV indicating the start of transmission is also changed depending on the size of the circular buffer.

Referring to 20b of FIG. 20, in the 1st tx, since a code rate is 7/20, puncturing is performed. 20 coded bits corresponding to the payload size E are selected from the location of the circular buffer corresponding to RV0 (20r1), and the selected coded bits are transmitted.

Referring to 20c of FIG. 20, in the 2nd tx, since a code rate is 7/24, puncturing is performed. In the 2nd tx, the increased mother code size is used. A location according to RV1 of 20r2 not RV1 of 20r1 is used based on the mother code size increased compared to the initial transmission. Specifically, 24 coded bits corresponding to the payload size E are selected at a location (index 16) on the circular buffer corresponding to RV1 of 20r2, and the selected coded bits are transmitted.

Referring to 20d of FIG. 20, in the 3rd tx, since a code rate is 7/30, puncturing is performed. Since the mother code size is 64 in the same manner as the 2nd tx, 30 coded bits corresponding to the payload size E are selected at a location (index 32) on the circular buffer corresponding to RV2 of 20r2, and the selected coded bits are transmitted.

The above-described embodiments have been described focusing on the PDSCH reception operation of the UE for convenience of explanation, but embodiments of the present disclosure are not limited only to the PDSCH signaling operation and can also be applied to a PUSCH signaling operation.

From an implementation prospective, operations according to the above-described embodiments (e.g., operations related to signaling for supporting the polar code-based IR-HARQ robust to the PDCCH error) can be processed by the device of FIGS. 1 to 4 and FIG. 6 (e.g., the processors 202a and 202b of FIG. 2).

Further, operations according to the above-described embodiments (e.g., operations related to signaling for supporting the polar code-based IR-HARQ robust to the PDCCH error) may be stored in a memory (e.g., the memories 204a and 204b of FIG. 2) in the form of commands/programs (e.g., instructions, executable codes) for running at least one processor (e.g., the processors 202a and 202b of FIG. 2).

Below, the above embodiments are described in detail in terms of operations of the UE and the base station (e.g., the first wireless device 200a and the second wireless device 200b of FIG. 2) with reference to FIGS. 21 and 22. Methods described below are merely distinguished for convenience of explanation. Thus, it is obvious that partial configuration of any method can be substituted or combined with partial configuration of another method.

Figure 21:
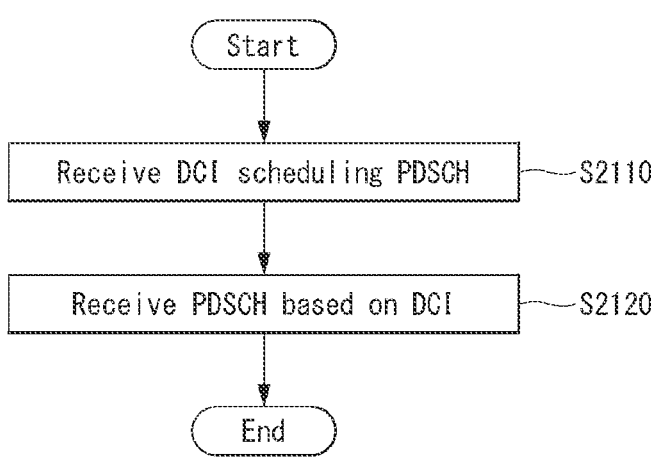
FIG. 21 is a flow chart illustrating a method for a UE to receive a physical downlink shared channel in accordance with an embodiment of the present disclosure.

FIG. 21 is a flow chart illustrating a method for a UE to receive a physical downlink shared channel in accordance with an embodiment of the present disclosure.

Referring to FIG. 21, a method for a UE to receive a physical downlink shared channel (PDSCH) in accordance with an embodiment of the present disclosure includes a step S2110 of receiving DCI scheduling the PDSCH and a step S2120 of receiving the PDSCH based on the DCI.

In the step S2110, the UE receives downlink control information (DCI) scheduling a physical downlink shared channel (PDSCH) from a base station (BS). The PDSCH may be related to a codeword generated based on a polar code.

According to the step S2110, an operation of the UE (e.g., 200a of FIG. 2) to receive the DCI scheduling the PDSCH from the BS (e.g., 200b of FIG. 2) may be implemented by a device of FIGS. 1 to 4. For example, referring to FIG. 2, one or more processors 202a may control one or more memories 204a and/or one or more transceivers 206a so as to receive the DCI scheduling the PDSCH from the BS 200b.

In the step S2120, the UE receives the PDSCH from the BS based on the DCL.

According to an embodiment, if a transmission of the PDSCH is an initial transmission, the PDSCH may be related to a first codeword generated based on a first polar code.

The first codeword may be generated based on one or more first bit channel indexes allocated to a data block related to the PDSCH among bit channel indexes of the first polar code.

According to an embodiment, if the transmission of the PDSCH is a retransmission, the PDSCH may be related to a second codeword generated based on a second polar code.

The second codeword may be generated based on one or more second bit channel indexes allocated to the data block among bit channel indexes of the second polar code.

According to an embodiment, the one or more second bit channel indexes may include i) the one or more first bit channel indexes or ii) bit channel indexes obtained by adding a second specific value to the one or more first bit channel indexes. A detailed example thereof is described below with reference to FIG. 16.

If a size of the first polar code (e.g., a value of a mother code size N) is 32, the one or more first bit channel indexes selected in order of reliability (e.g., descending order) based on a size (K=4) of the data block related to the first codeword in a polar encoder may be 31, 30, 29, and 27 (see (a) of FIG. 16).

In the i), the one or more second bit channel indexes may be 31, 30, 29, and 27. In the ii), the one or more second bit channel indexes may be 63, 62, 61, and 59. In this instance, the second specific value may be 32.

According to an embodiment, the second specific value may be based on a difference between a size of the second polar code and the size of the first polar code. This is described in detail with reference to examples related to the one or more second bit channel indexes.

If the size N of the second polar code is 32, the second specific value is 0 (=32−32). Therefore, the one or more second bit channel indexes are the same as to the one or more first bit channel indexes.

If the size N of the second polar code is 64, the second specific value is 32 (=64−32). Therefore, the one or more second bit channel indexes may be bit channel indexes (e.g., 63, 62, 61, and 59) obtained by adding 32 to the one or more first bit channel indexes (e.g., 31, 30, 29, and 27).

According to an embodiment, the second polar code has a size of $2^n$ times the size of the first polar code, where n is an integer equal to or greater than 0. In this instance, considering complexity, a maximum value of the size of the second polar code may be limited to 2 or 4 times the size of the first polar code.

According to an embodiment, if the one or more second bit channel indexes include one or more third bit channel indexes belonging to a lower polar subcode of the second polar code, the one or more second bit channel indexes may further include one or more fourth bit channel indexes determined based on the one or more third bit channel indexes.

To prevent a repeated failure of decoding of a codeword related to retransmission of a subsequent PDSCH due to an error of a PDCCH scheduling the initial transmission (PDSCH), the DCI may include the following information.

According to an embodiment, the DCI may include i) information representing a size of a polar code related to the PDSCH, ii) information representing whether the one or more fourth bit channel indexes are used to generate a codeword related to the PDSCH, and iii) information representing a redundancy version (RV) related to the PDSCH.

According to an embodiment, the information representing the RV may represent one of one or more values determined based on the size of the polar code related to the PDSCH. The one or more values determined based on the size of the polar code related to the PDSCH may be related to at least one of i) a starting point of a lower polar subcode of the polar code related to the PDSCH or ii) a starting point of an upper polar subcode of the polar code related to the PDSCH. This is described below with reference to 19r of FIG. 19. The one or more values determined based on the size of the polar code related to the PDSCH may include {0, 8, 16, 24} that are locations within a circular buffer. In this instance, 0 and 16 corresponding to RV0 and RV2 correspond to the starting point of the lower polar subcode and the starting point of the upper polar subcode, respectively.

According to an embodiment, the one or more values determined based on the size of the polar code related to the PDSCH may be related to one or more specific locations of locations within the circular buffer to which the codeword related to the PDSCH is input.

According to an embodiment, the one or more specific locations may be related to at least one of i) a first bit channel index of the lower polar subcode of the polar code related to the PDSCH or ii) a first bit channel index of the upper polar subcode of the polar code related to the PDSCH.

According to an embodiment, the one or more values determined based on the size of the polar code related to the PDSCH may be determined based on the size of the first polar code and the number of bits of the information representing the RV.

For example, it is assumed that the size of the first polar code is N and the number of bits of the information representing the RV is b. In this instance, the one or more values determined based on the size of the polar code related to the PDSCH may be determined to have an interval of $$\frac{N}{2^b}.$$

If $N/2^b$. If N is 32 and b is 2, the one or more values determined based on the size of the polar code related to the PDSCH may be determined as {0, 8, 16, 24}. {0, 8, 16, 24} may correspond to {RV0, RV1, RV2, RV3}.

According to an embodiment, based on the transmission of the PDSCH being the retransmission, the one or more values determined based on the size of the polar code related to the PDSCH may include at least one of 0 or a value based on the size N of the first polar code. This is described using 20r2 of FIG. 20 as an example. The size N of the first polar code is 32, and the size 2N of the second polar code is 64. Referring to 20r2 of FIG. 20, a value corresponding to RV0 is 0 in the same manner as the initial transmission (20r1), and a value corresponding to RV2 is 32 that is a value based on the size N of the first polar code.

According to an embodiment, based on the size of the second polar code being greater than the size of the first polar code and a size of the data block being greater than or equal to a specific value, the one or more second bit channel indexes may further include the one or more fourth bit channel indexes.

According to an embodiment, the specific value may be determined based on a ranking of a bit channel index with a highest value of reliability among the bit channel indexes belonging to the lower polar subcode of the second polar code.

The ranking may be defined as an order based on a value of the reliability within a range of all bit channel indexes of the second polar code.

The above-described embodiments may be based on the description of FIG. 15 related to the copy operation. Specifically, when the size N of the second polar code is 16, bit channel indexes belonging to the lower polar subcode are 0 to 7. A bit channel index with the highest reliability among the bit channel indexes 0 to 7 is 7. All the bit channel indexes of the second polar code rearranged based on the order of reliability (descending order) are bit channel indexes based on the reverse order of 15d as follows.

{15,14,13,11,7,12,10,9,6,5,3,8,4,2,1,0}

The bit channel index 7 with the highest reliability among the bit channel indexes of the lower polar subcode has the fifth ranking of all the bit channel indexes {15, 14, 13, 11, 7, 12, 10, 9, 6, 5, 3, 8, 4, 2, 1, 0} rearranged based on the order of reliability (descending order). Therefore, in this case, the specific value is 5.

If the size K of the data block related to the first codeword is greater than or equal to 5, the second codeword generated for retransmission does not include the first codeword (15b). Accordingly, the one or more second bit channel indexes may further include the one or more fourth bit channel indexes so that characteristics for the support of IR-HARQ are satisfied.

According to an embodiment, the one or more fourth bit channel indexes may be determined based on the number of the one or more third bit channel indexes and the size of the data block.

The one or more fourth bit channel indexes may be based on a specific number of bit channel indexes determined in a specific range of the second polar code.

The specific range may be based on a range excluding specific bit channel indexes determined based on the size of the data block and the order of reliability among the bit channel indexes of the second polar code.

The above-described embodiments are described below with reference to FIG. 17. Referring to 17c of FIG. 17, the one or more third bit channel indexes are based on bit channel index 31 belonging to the lower polar subcodes (0 to 31). The size K of the data block is 7.

The specific bit channel indexes determined based on the size (7) of the data block and the order of reliability (descending order) are {63, 62, 61, 59, 55, 47, 31} (see (b) of FIG. 16). The one or more fourth bit channel indexes may be determined in a range excluding the specific bit channel indexes {63, 62, 61, 59, 55, 47, 31} among the bit channel indexes (0 to 63) of the second polar code.

According to an embodiment, the specific number of bit channel indexes may be based on a specific number of bit channel indexes determined based on the order of reliability among bit channel indexes of the upper polar subcode based on the specific range. The specific number may be based on the number of the one or more third bit channel indexes. This is described in detail below with reference to FIG. 17.

Referring to 17c of FIG. 17, the specific number of bit channel indexes are based on bit channel index 60. The one or more third bit channel indexes are based on the bit channel index 31, and thus the specific number is 1.

As described in the example related to FIG. 17, the bit channel indexes of the upper polar subcode based on the specific range may be bit channel indexes excluding bit channel indexes {63, 62, 61, 59, 55, 47, 31} from bit channel indexes (32 to 63).

One bit channel index with the largest reliability among the bit channel indexes of the upper polar subcode based on the specific range is the bit channel index 60. Thus, the one or more fourth bit channel indexes may be based on the bit channel index 60.

According to the step S2120, an operation of the UE (e.g., 200a of FIG. 2) to receive the PDSCH from the BS (e.g., 200b of FIG. 2) based on the DCI may be implemented by a device of FIGS. 1 to 4. For example, referring to FIG. 2, one or more processors 202a may control one or more memories 204a and/or one or more transceivers 206a so as to receive the PDSCH from the BS 200b based on the DCI.

Figure 22:
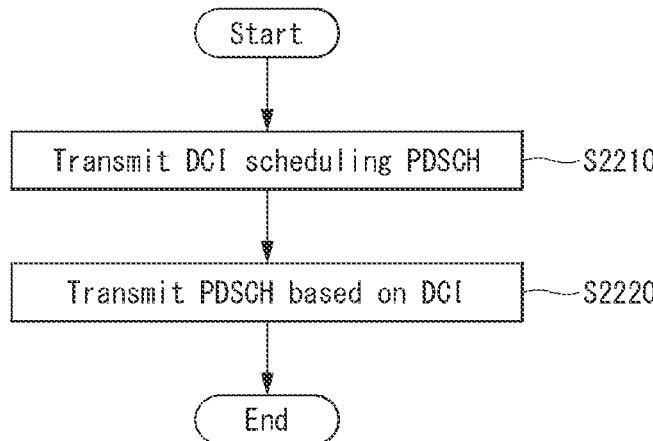
FIG. 22 is a flow chart illustrating a method for a base station to transmit a physical downlink shared channel in accordance with another embodiment of the present disclosure.

FIG. 22 is a flow chart illustrating a method for a base station to transmit a physical downlink shared channel in accordance with another embodiment of the present disclosure.

Referring to FIG. 22, a method for a base station (BS) to transmit a physical downlink shared channel (PDSCH) in accordance with another embodiment of the present disclosure includes a step S2210 of transmitting DCI scheduling the PDSCH and a step S2220 of transmitting the PDSCH based on the DCI.

In the step S2210, the BS transmits downlink control information (DCI) scheduling a physical downlink shared channel (PDSCH) to a UE. The PDSCH may be related to a codeword generated based on a polar code.

According to the step S2210, an operation of the BS (e.g., 200b of FIG. 2) to transmit the DCI scheduling the PDSCH to the UE (e.g., 200a of FIG. 2) may be implemented by a device of FIGS. 1 to 4. For example, referring to FIG. 2, one or more processors 202b may control one or more memories 204a and/or one or more transceivers 206a so as to transmit the DCI scheduling the PDSCH to the UE 200a.

In the step S2220, the BS transmits, to the UE, the PDSCH based on the DCI.

According to an embodiment, if a transmission of the PDSCH is an initial transmission, the PDSCH may be related to a first codeword generated based on a first polar code.

The first codeword may be generated based on one or more first bit channel indexes allocated to a data block related to the PDSCH among bit channel indexes of the first polar code.

According to an embodiment, if the transmission of the PDSCH is a retransmission, the PDSCH may be related to a second codeword generated based on a second polar code.

The second codeword may be generated based on one or more second bit channel indexes allocated to the data block among bit channel indexes of the second polar code.

According to an embodiment, the one or more second bit channel indexes may include i) the one or more first bit channel indexes or ii) bit channel indexes obtained by adding a second specific value to the one or more first bit channel indexes. A detailed example thereof is described below with reference to FIG. 16.

If a size of the first polar code (e.g., a value of a mother code size N) is 32, the one or more first bit channel indexes selected in order of reliability (e.g., descending order) based on a size (K=4) of the data block related to the first codeword in a polar encoder may be 31, 30, 29, and 27 (see (a) of FIG. 16).

In the i), the one or more second bit channel indexes may be 31, 30, 29, and 27. In the ii), the one or more second bit channel indexes may be 63, 62, 61, and 59. In this instance, the second specific value may be 32.

According to an embodiment, the second specific value may be based on a difference between a size of the second polar code and the size of the first polar code. This is described in detail with reference to examples related to the one or more second bit channel indexes.

If the size N of the second polar code is 32, the second specific value is 0 (=32−32). Therefore, the one or more second bit channel indexes are the same as to the one or more first bit channel indexes.

If the size N of the second polar code is 64, the second specific value is 32 (=64−32). Therefore, the one or more second bit channel indexes may be bit channel indexes (e.g., 63, 62, 61, and 59) obtained by adding 32 to the one or more first bit channel indexes (e.g., 31, 30, 29, and 27).

According to an embodiment, the second polar code has a size of $2^n$ times the size of the first polar code, where n is an integer equal to or greater than 0. In this instance, considering complexity, a maximum value of the size of the second polar code may be limited to 2 or 4 times the size of the first polar code.

According to an embodiment, if the one or more second bit channel indexes include one or more third bit channel indexes belonging to a lower polar subcode of the second polar code, the one or more second bit channel indexes may further include one or more fourth bit channel indexes determined based on the one or more third bit channel indexes.

To prevent a repeated failure of decoding of a codeword related to retransmission of a subsequent PDSCH due to an error of a PDCCH scheduling the initial transmission (PDSCH), the DCI may include the following information.

According to an embodiment, the DCI may include i) information representing a size of a polar code related to the PDSCH, ii) information representing whether the one or more fourth bit channel indexes are used to generate a codeword related to the PDSCH, and iii) information representing a redundancy version (RV) related to the PDSCH.

According to an embodiment, the information representing the RV may represent one of one or more values determined based on the size of the polar code related to the PDSCH. The one or more values determined based on the size of the polar code related to the PDSCH may be related to at least one of i) a starting point of a lower polar subcode of the polar code related to the PDSCH or ii) a starting point of an upper polar subcode of the polar code related to the PDSCH. This is described below with reference to 19r of FIG. 19. The one or more values determined based on the size of the polar code related to the PDSCH may include {0, 8, 16, 24} that are locations within a circular buffer. In this instance, 0 and 16 corresponding to RV0 and RV2 correspond to the starting point of the lower polar subcode and the starting point of the upper polar subcode, respectively.

According to an embodiment, the one or more values determined based on the size of the polar code related to the PDSCH may be related to one or more specific locations of locations within the circular buffer to which the codeword related to the PDSCH is input.

According to an embodiment, the one or more specific locations may be related to at least one of i) a first bit channel index of the lower polar subcode of the polar code related to the PDSCH or ii) a first bit channel index of the upper polar subcode of the polar code related to the PDSCH.

According to an embodiment, the one or more values determined based on the size of the polar code related to the PDSCH may be determined based on the size of the first polar code and the number of bits of the information representing the RV.

For example, it is assumed that the size of the first polar code is N and the number of bits of the information representing the RV is b. In this instance, the one or more values determined based on the size of the polar code related to the PDSCH may be determined to have an interval of $$\frac{N}{2^b}.$$

If N is 32 and b is 2, the one or more values determined based on the size of the polar code related to the PDSCH may be determined as {0, 8, 16, 24}. {0, 8, 16, 24} may correspond to {RV0, RV1, RV2, RV3}.

According to an embodiment, based on the transmission of the PDSCH being the retransmission, the one or more values determined based on the size of the polar code related to the PDSCH may include at least one of 0 or a value based on the size N of the first polar code. This is described using 20$r$2 of FIG. 20 as an example. The size N of the first polar code is 32, and the size 2N of the second polar code is 64. Referring to 20$r$2 of FIG. 20, a value corresponding to RV0 is 0 in the same manner as the initial transmission (20$r$1), and a value corresponding to RV0 is 32 that is a value based on the size N of the first polar code.

According to an embodiment, based on the size of the second polar code being greater than the size of the first polar code and a size of the data block being greater than or equal to a specific value, the one or more second bit channel indexes may further include the one or more fourth bit channel indexes.

According to an embodiment, the specific value may be determined based on a ranking of a bit channel index with a highest value of reliability among the bit channel indexes belonging to the lower polar subcode of the second polar code.

The ranking may be defined as an order based on a value of the reliability within a range of all bit channel indexes of the second polar code.

The above-described embodiments may be based on the description of FIG. 15 related to the copy operation. Specifically, when the size N of the second polar code is 16, bit channel indexes belonging to the lower polar subcode are 0 to 7. A bit channel index with the highest reliability among the bit channel indexes 0 to 7 is 7. All the bit channel indexes of the second polar code rearranged based on the order of reliability (descending order) are bit channel indexes based on the reverse order of 15d as follows.

{15,14,13,11,7,12,10,9,6,5,3,8,4,2,1,0}

The bit channel index 7 with the highest reliability among the bit channel indexes of the lower polar subcode has the fifth ranking of all the bit channel indexes {15, 14, 13, 11, 7, 12, 10, 9, 6, 5, 3, 8, 4, 2, 1, 0} rearranged based on the order of reliability (descending order). Therefore, in this case, the specific value is 5.

If the size K of the data block related to the first codeword is greater than or equal to 5, the second codeword generated for retransmission does not include the first codeword (15$b$). Accordingly, the one or more second bit channel indexes may further include the one or more fourth bit channel indexes so that characteristics for the support of IR-HARQ are satisfied.

According to an embodiment, the one or more fourth bit channel indexes may be determined based on the number of the one or more third bit channel indexes and the size of the data block.

The one or more fourth bit channel indexes may be based on a specific number of bit channel indexes determined in a specific range of the second polar code.

The specific range may be based on a range excluding specific bit channel indexes determined based on the size of the data block and the order of reliability among the bit channel indexes of the second polar code.

The above-described embodiments are described below with reference to FIG. 17. Referring to 17$c$ of FIG. 17, the one or more third bit channel indexes are based on bit channel index 31 belonging to the lower polar subcodes (0 to 31). The size K of the data block is 7.

The specific bit channel indexes determined based on the size (7) of the data block and the order of reliability (descending order) are {63, 62, 61, 59, 55, 47, 31} (see (b) of FIG. 16). The one or more fourth bit channel indexes may be determined in a range excluding the specific bit channel indexes {63, 62, 61, 59, 55, 47, 31} among the bit channel indexes (0 to 63) of the second polar code.

According to an embodiment, the specific number of bit channel indexes may be based on a specific number of bit channel indexes determined based on the order of reliability among bit channel indexes of the upper polar subcode based on the specific range. The specific number may be based on the number of the one or more third bit channel indexes. This is described in detail below with reference to FIG. 17.

Referring to 17$c$ of FIG. 17, the specific number of bit channel indexes are based on bit channel index 60. The one or more third bit channel indexes are based on the bit channel index 31, and thus the specific number is 1.

As described in the example related to FIG. 17, the bit channel indexes of the upper polar subcode based on the specific range may be bit channel indexes excluding bit channel indexes {63, 62, 61, 59, 55, 47, 31} from bit channel indexes {32 to 63}

One bit channel index with the largest reliability among the bit channel indexes of the upper polar subcode based on the specific range is the bit channel index 60. Thus, the one or more fourth bit channel indexes may be based on the bit channel index 60.

According to the step S2220, an operation of the BS (e.g., 200$b$ of FIG. 2) to transmit, to the UE (e.g., 200$a$ of FIG. 2), the PDSCH based on the DCI may be implemented by a device of FIGS. 1 to 4. For example, referring to FIG. 2, one or more processors 202$b$ may control one or more memories 204$a$ and/or one or more transceivers 206$a$ so as to transmit, to the UE 200$a$, the PDSCH based on the DCI.

The above-described embodiments have been described focusing on a PDSCH reception operation of a UE (a PDSCH transmission operation of a BS) based on DCI, but embodiments of the present disclosure are not limited to the PDSCH reception operation of the UE (the PDSCH transmission operation of the BS) and can be applied to a PUSCH transmission operation of the UE (a PUSCH reception operation of the BS). Below, duplicate description is omitted, and the above-described embodiments are described focusing on the PUSCH transmission operation of the UE (the PUSCH reception operation of the BS).

A UE receives downlink control information (DCI) scheduling a physical uplink shared channel (PUSCH) from a BS. The PUSCH may be related to a codeword generated based on a polar code.

An operation of the UE (e.g., 200$a$ of FIG. 2) to receive the DCI scheduling the PUSCH from the BS (e.g., 200$b$ of FIG. 2) may be implemented by a device of FIGS. 1 to 4. For example, referring to FIG. 2, one or more processors 202$a$ may control one or more memories 204$a$ and/or one or more transceivers 206$a$ so as to receive the DCI scheduling the PUSCH from the BS 200$b$.

The UE transmits the PUSCH to the BS based on the DCI.

According to an embodiment, if a transmission of the PUSCH is an initial transmission, the PUSCH may be related to a first codeword generated based on a first polar code.

The first codeword may be generated based on one or more first bit channel indexes allocated to a data block related to the PUSCH among bit channel indexes of the first polar code.

According to an embodiment, if the transmission of the PUSCH is a retransmission, the PUSCH may be related to a second codeword generated based on a second polar code.

The second codeword may be generated based on one or more second bit channel indexes allocated to the data block among bit channel indexes of the second polar code.

According to an embodiment, if the one or more second bit channel indexes include one or more third bit channel indexes belonging to a lower polar subcode of the second polar code, the one or more second bit channel indexes may further include one or more fourth bit channel indexes determined based on the one or more third bit channel indexes.

To prevent a repeated failure of decoding of a codeword related to retransmission of a subsequent PUSCH due to an error of a PDCCH scheduling the initial transmission (PUSCH), the DCI may include the following information.

According to an embodiment, the DCI may include i) information representing a size of a polar code related to the PUSCH, ii) information representing whether the one or more fourth bit channel indexes are used to generate a codeword related to the PUSCH, and iii) information representing a redundancy version (RV) related to the PUSCH.

According to an embodiment, the information representing the RV may represent one of one or more values determined based on the size of the polar code related to the PUSCH. The one or more values determined based on the size of the polar code related to the PUSCH may be related to at least one of i) a starting point of a lower polar subcode of the polar code related to the PUSCH or ii) a starting point of an upper polar subcode of the polar code related to the PUSCH.

According to an embodiment, the one or more values determined based on the size of the polar code related to the PUSCH may be related to one or more specific locations of locations within a circular buffer to which the codeword related to the PUSCH is input.

According to an embodiment, the one or more specific locations may be related to at least one of i) a first bit channel index of the lower polar subcode of the polar code related to the PUSCH or ii) a first bit channel index of the upper polar subcode of the polar code related to the PUSCH.

According to an embodiment, the one or more values determined based on the size of the polar code related to the PUSCH may be determined based on the size of the first polar code and the number of bits of the information representing the RV.

For example, it is assumed that the size of the first polar code is N and the number of bits of the information representing the RV is b. In this instance, the one or more values determined based on the size of the polar code related to the PUSCH may be determined to have an interval of $$\frac{N}{2^b}.$$

If $N/2^b$. If N is 32 and b is 2, the one or more values determined based on the size of the polar code related to the PUSCH may be determined as {0, 8, 16, 24}. {0, 8, 16, 24} may correspond to {RV0, RV1, RV2. RV3}.

According to an embodiment, based on the transmission of the PUSCH being the retransmission, the one or more values determined based on the size of the polar code related to the PUSCH may include at least one of 0 or a value based on the size N of the first polar code. This is described using $20r2$ of FIG. 20 as an example. The size N of the first polar code is 32, and the size 2N of the second polar code is 64. Referring to $20r2$ of FIG. 20, a value corresponding to RV0 is 0 in the same manner as the initial transmission ($20r1$), and a value corresponding to RV2 is 32 that is a value based on the size N of the first polar code.

An operation of the UE (e.g., $200a$ of FIG. 2) to transmit the PUSCH to the BS (e.g., $200b$ of FIG. 2) based on the DCI may be implemented by a device of FIGS. 1 to 4. For example, referring to FIG. 2, one or more processors $202a$ may control one or more memories $204a$ and/or one or more transceivers $206a$ so as to transmit the PUSCH to the BS $200b$ based on the DCI.

The above-described operation has been described focusing on the operation of the UE for convenience of explanation. However, the DCI reception operation of the UE corresponds to the DCI transmission operation of the BS, and the PUSCH transmission operation of the UE corresponds to the PUSCH reception operation of the BS.

Effects of a method of transmitting and receiving a physical shared channel based on HARQ in a wireless communication system according to an embodiment of the present disclosure and a device therefor are described as follows.

According to embodiments of the present disclosure, if a transmission of a PDSCH is a retransmission, a second codeword related to the PDSCH is generated based on one or more fourth bit channel indexes. Even if a data bit is arranged to a bit channel index of a lower polar subcode, the second codeword is generated based on the one or more fourth bit channel indexes, and thus support characteristics of IR-HARQ can be satisfied. As above, since IR HARQ based on a polar code can be used for data transmission, system performance can be improved in terms of reliability.

Further, according to an IR HARQ scheme based on the polar code, since the received bits are immediately combined without going through decoding, performance of a polar code based HARQ operation can be further improved compared to the existing IF-HARQ scheme.

According to embodiments of the present disclosure, DCI scheduling the PDSCH includes information representing whether the one or more fourth bit channel indexes are used to generate the codeword related to the PDSCH.

Accordingly, even if a UE fails to receive a PDCCH scheduling an initial transmission, the UE can normally perform, based on DCI scheduling a subsequently retransmitted PDSCH, decoding of a codeword related to the PDSCH. For the polar code-based IR-HARQ applied to the data transmission, robustness for a PDCCH error can be improved.

Further, an error operation due to the PDCCH detection failure (PDSCH related codeword decoding failure) is prevented. Since the unnecessary PDSCH retransmission is prevented, a signaling procedure for the polar code based IR-HARQ support can be improved in terms of signaling overhead and UE power consumption.

According to embodiments of the present disclosure, the DCI includes information indicating a redundancy version

65

(RV) related to the PDSCH, and the information indicating the RV represents one of one or more values determined based on a size of the polar code related to the PDSCH. The one of one or more values determined based on the size of the polar code related to the PDSCH may be related to one or more specific locations of locations within a circular buffer to which the codeword related to the PDSCH is input. Further, the one or more specific locations may be related to at least one of i) a first bit channel index of a lower polar subcode of the polar code related to the PDSCH or ii) a first bit channel index of an upper polar subcode of the polar code related to the PDSCH.

If coded bits within the circular buffer are selected and retransmitted based on a type of rate matching, a starting point of the lower polar subcode or a starting point of the upper polar subcode may be indicated within the circular buffer through the RV. Therefore, decoding of a codeword related to the retransmission can be performed based on a mother code size that is less than the mother code size used to generate the codeword. As a result, there is an advantage in terms of receiver implementation complexity.

Here, the wireless communication technology implemented in the device (e.g., *200a*/*200b* of FIG. 2) of the present disclosure may include LTE, NR, and 6G as well as Narrowband Internet of Things (NB-IoT) for low-power communication. For example, the NB-IoT technology may be an example of a LPWAN (Low Power Wide Area Network) technology, and may be implemented in standards such as LTE Cat NB1 and/or LTE Cat NB2, and is not limited to the above-described name. Additionally or alternatively, the wireless communication technology implemented in the device (e.g., *200a*/*200b* of FIG. 2) of the present disclosure may perform communication based on the LTE-M technology. For example, the LTE-M technology may be an example of LPWAN technology, and may be called by various names such as enhanced machine type communication (eMTC). For example, LTE-M technology may be implemented in at least one of various standards such as 1) LTE CAT 0, 2) LTE Cat M1, 3) LTE Cat M2, 4) LTE non-BL (non-Bandwidth Limited), 5) LTE-MTC, 6) LTE Machine Type Communication, and/or 7) LTE M, and is not limited to the above-described name. Additionally or alternatively, the wireless communication technology implemented in the device (e.g., *200a*/*200b* of FIG. 2) of the present disclosure may include at least one of ZigBee, Bluetooth, and Low Power Wide Area Network (LPWAN) in consideration of low power communication, and is not limited to the above-described name. For example, the ZigBee technology may generate PAN (personal area networks) related to small/low-power digital communication based on various standards such as IEEE 802.15.4, and may be called by various names.

The embodiments of the present disclosure described above are combinations of elements and features of the present disclosure. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present disclosure or included as a new claim by subsequent amendment after the application is filed.

The embodiments of the present disclosure may be achieved by various means, for example, hardware, firmware, software, or a combination thereof. In a hardware configuration, the methods according to the embodiments of the present disclosure may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the embodiments of the present disclosure may be implemented in the form of a module, a procedure, a function, etc. For example, software code may be stored in a memory unit and executed by a processor. The memories may be located at the interior or exterior of the processors and may transmit data to and receive data from the processors via various known means.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The invention claimed is:

1. A method of a user equipment (UE) for receiving a physical downlink shared channel (PDSCH) in a wireless communication system, the method comprising:

receiving downlink control information (DCI) scheduling the PDSCH, the PDSCH being related to a codeword generated based on a polar code; and receiving the PDSCH based on the DCI, wherein, based on a transmission of the PDSCH being an initial transmission, the PDSCH is related to a first codeword generated based on a first polar code, wherein the first codeword is generated based on one or more first bit channel indexes allocated to a data block related to the PDSCH among bit channel indexes of the first polar code, wherein, based on the transmission of the PDSCH being a retransmission, the PDSCH is related to a second codeword generated based on a second polar code, wherein the second codeword is generated based on one or more second bit channel indexes allocated to the data block among bit channel indexes of the second polar code, wherein, based on the one or more second bit channel indexes including one or more third bit channel indexes belonging to a lower polar subcode of the second polar code, the one or more second bit channel indexes further include one or more fourth bit channel indexes determined based on the one or more third bit channel indexes, wherein the DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH, wherein the information representing the RV represents one of one or more values determined based on the size of the polar code related to the PDSCH, and wherein the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

2. The method of claim 1, wherein the one or more values determined based on the size of the polar code related to the PDSCH are related to one or more specific locations of locations within a circular buffer to which the codeword related to the PDSCH is input.

3. The method of claim 2, wherein the one or more specific locations are related to at least one of i) a first bit channel index of the lower polar subcode of the polar code related to the PDSCH or ii) a first bit channel index of the upper polar subcode of the polar code related to the PDSCH.

4. The method of claim 3, wherein the one or more values determined based on the size of the polar code related to the PDSCH are determined based on a size of the first polar code and a number of bits of the information representing the RV.

5. The method of claim 1, wherein, based on a size of the second polar code being greater than a size of the first polar code and a size of the data block being greater than or equal to a specific value, the one or more second bit channel indexes further include the one or more fourth bit channel indexes.

6. The method of claim 5, wherein the specific value is determined based on a ranking of a bit channel index with a highest value of a reliability among bit channel indexes belonging to the lower polar subcode of the second polar code, and wherein the ranking is defined as an order based on a value of the reliability within a range of all bit channel indexes of the second polar code.

7. The method of claim 1, wherein the one or more fourth bit channel indexes are determined based on a number of the one or more third bit channel indexes and a size of the data block.

8. The method of claim 7, wherein the one or more fourth bit channel indexes are based on a specific number of bit channel indexes determined in a specific range of the second polar code, and wherein the specific range is based on a range excluding specific bit channel indexes determined based on the size of the data block and an order of a reliability among the bit channel indexes of the second polar code.

9. The method of claim 8, wherein the specific number of bit channel indexes are based on a specific number of bit channel indexes determined based on the order of the reliability among bit channel indexes of an upper polar subcode based on the specific range.

10. The method of claim 9, wherein the specific number is based on the number of the one or more third bit channel indexes.

11. A user equipment (UE) receiving a physical downlink shared channel (PDSCH) in a wireless communication system, the UE comprising:

one or more transceivers;

one or more processors configured to control the one or more transceivers; and one or more memories operably connectable to the one or more processors, wherein the one or more memories are configured to store instructions that allow the one or more processors to perform operations based on being executed by the one or more processors, wherein the operations comprise:

receiving downlink control information (DCI) scheduling the PDSCH, the PDSCH being related to a codeword generated based on a polar code; and receiving the PDSCH based on the DCI, wherein, based on a transmission of the PDSCH being an initial transmission, the PDSCH is related to a first codeword generated based on a first polar code, wherein the first codeword is generated based on one or more first bit channel indexes allocated to a data block related to the PDSCH among bit channel indexes of the first polar code, wherein, based on the transmission of the PDSCH being a retransmission, the PDSCH is related to a second codeword generated based on a second polar code, wherein the second codeword is generated based on one or more second bit channel indexes allocated to the data block among bit channel indexes of the second polar code, wherein, based on the one or more second bit channel indexes including one or more third bit channel indexes belonging to a lower polar subcode of the second polar code, the one or more second bit channel indexes further include one or more fourth bit channel indexes determined based on the one or more third bit channel indexes, wherein the DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH, wherein the information representing the RV represents one of one or more values determined based on the size of the polar code related to the PDSCH, and wherein the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

12. A base station (BS) transmitting a physical downlink shared channel (PDSCH) in a wireless communication system, the BS comprising:

one or more transceivers;

one or more processors configured to control the one or more transceivers; and one or more memories operably connectable to the one or more processors, wherein the one or more memories are configured to store instructions that allow the one or more processors to perform operations based on being executed by the one or more processors, wherein the operations comprise:

transmitting downlink control information (DCI) scheduling the PDSCH, the PDSCH being related to a codeword generated based on a polar code; and transmitting the PDSCH based on the DCI, wherein, based on a transmission of the PDSCH being an initial transmission, the PDSCH is related to a first codeword generated based on a first polar code, wherein the first codeword is generated based on one or more first bit channel indexes allocated to a data block related to the PDSCH among bit channel indexes of the first polar code, wherein, based on the transmission of the PDSCH being a retransmission, the PDSCH is related to a second codeword generated based on a second polar code, wherein the second codeword is generated based on one or more second bit channel indexes allocated to the data block among bit channel indexes of the second polar code, wherein, based on the one or more second bit channel indexes including one or more third bit channel indexes belonging to a lower polar subcode of the second polar code, the one or more second bit channel indexes further include one or more fourth bit channel indexes determined based on the one or more third bit channel indexes, wherein the DCI includes i) information representing a size of a polar code related to the PDSCH, ii) information representing whether the one or more fourth bit channel indexes are used to generate a codeword related to the PDSCH, and iii) information representing a redundancy version (RV) related to the PDSCH, wherein the information representing the RV represents one of one or more values determined based on the size of the polar code related to the PDSCH, and wherein the one or more values determined based on the size of the polar code related to the PDSCH are related to at least one of i) a starting point of a lower polar subcode of the polar code related to the PDSCH or ii) a starting point of an upper polar subcode of the polar code related to the PDSCH.

* * * * *